US009257627B2

(12) United States Patent
Aguirre et al.

(10) Patent No.: US 9,257,627 B2
(45) Date of Patent: Feb. 9, 2016

(54) METHOD AND STRUCTURE FOR THERMOELECTRIC UNICOUPLE ASSEMBLY

(71) Applicant: Alphabet Energy, Inc., Hayward, CA (US)

(72) Inventors: Mario Aguirre, Livermore, CA (US); Matthew L. Scullin, San Francisco, CA (US)

(73) Assignee: Alphabet Energy, Inc., Hayward, CA (US)

( * ) Notice: Subject to any disclaimer, the term of this patent is extended or adjusted under 35 U.S.C. 154(b) by 0 days.

(21) Appl. No.: 13/947,400

(22) Filed: Jul. 22, 2013

(65) Prior Publication Data

US 2014/0024163 A1     Jan. 23, 2014

Related U.S. Application Data

(60) Provisional application No. 61/674,816, filed on Jul. 23, 2012.

(51) Int. Cl.
*H01L 35/34*     (2006.01)
*H01L 27/16*     (2006.01)

(52) U.S. Cl.
CPC ............... *H01L 35/34* (2013.01); *H01L 27/16* (2013.01)

(58) Field of Classification Search
CPC ......... H01L 35/28; H01L 35/32; H01L 35/34; H01L 27/16
USPC ......................................................... 136/201
See application file for complete search history.

(56) References Cited

U.S. PATENT DOCUMENTS 2,588,254 A    3/1952    Lark-Horovitz et al.
3,441,812 A    4/1969    De Bucs et al.
(Continued)

FOREIGN PATENT DOCUMENTS

CN    1352468    6/2002
CN    1957483    5/2007
(Continued)

OTHER PUBLICATIONS

Asheghi et al., "Phonon-Boundary Scattering in Thin Silicon Layers," *Appl. Phys. Lett.*, 71(13) (1997), 1798-1800.
(Continued)

*Primary Examiner* — Fernando L Toledo
*Assistant Examiner* — Christine C Lau
(74) *Attorney, Agent, or Firm* — Jones Day

(57) ABSTRACT

Method for assembling thermoelectric unicouples is provided and applied with silicon-based nanostructure thermoelectric legs. The method includes preparing and disposing both n-type and p-type thermoelectric material blocks in alternative columns on a first shunt material. The method includes a sequence of cutting processes to resize the thermoelectric material blocks to form multiple singulated unicouples each having an n-type thermoelectric leg and a p-type thermoelectric leg bonded to a section of the first shunt material. Additionally, the method includes re-disposing these singulated unicouples in a serial daisy chain configuration with a predetermined pitch distance and bonding a second shunt material on top. The method further includes performing additional cutting processes to form one or more daisy chains of thermoelectric unicouples. The first shunt material is coupled to a cold-side heat sink and the second shunt material is coupled to a hot-side heat sink.

22 Claims, 9 Drawing Sheets

(56) References Cited

U.S. PATENT DOCUMENTS

| | | |
|---|---|---|
| 4,251,286 A | 2/1981 | Barnett |
| 4,292,579 A | 9/1981 | Constant |
| 4,493,939 A * | 1/1985 | Blaske et al. ............... 136/212 |
| 4,842,699 A | 6/1989 | Hua et al. |
| 4,959,119 A | 9/1990 | Lantzer |
| 5,391,914 A | 2/1995 | Sullivan et al. |
| 5,723,799 A | 3/1998 | Murayama et al. |
| 5,824,561 A | 10/1998 | Kishi et al. |
| 5,837,929 A | 11/1998 | Adelman |
| 5,950,067 A * | 9/1999 | Maegawa et al. ............... 438/22 |
| 5,959,341 A | 9/1999 | Tsuno et al. |
| 6,300,150 B1 * | 10/2001 | Venkatasubramanian ...... 438/27 |
| 6,314,741 B1 | 11/2001 | Hiraishi |
| 6,389,983 B1 | 5/2002 | Coester et al. |
| 6,410,971 B1 | 6/2002 | Otey |
| 6,700,052 B2 | 3/2004 | Bell et al. |
| 6,843,902 B1 | 1/2005 | Penner et al. |
| 6,882,051 B2 | 4/2005 | Majumdar et al. |
| 6,894,215 B2 | 5/2005 | Akiba |
| 6,996,147 B2 | 2/2006 | Majumdar et al. |
| 7,267,859 B1 | 9/2007 | Rabin et al. |
| 6,410,971 C1 | 4/2008 | Otey |
| 7,361,313 B2 | 4/2008 | Chan et al. |
| 7,531,739 B1 | 5/2009 | Moczygemba |
| 7,569,202 B2 | 8/2009 | Farrell et al. |
| 7,605,327 B2 | 10/2009 | Roscheisen et al. |
| 7,713,778 B2 | 5/2010 | Li et al. |
| 7,820,292 B2 | 10/2010 | Shcherbakov et al. |
| 7,999,172 B2 | 8/2011 | Yu |
| 8,044,294 B2 | 10/2011 | Park et al. |
| 8,206,780 B2 | 6/2012 | Li et al. |
| 8,729,381 B2 | 5/2014 | Yang et al. |
| 8,736,011 B2 | 5/2014 | Yi et al. |
| 9,051,175 B2 | 6/2015 | Matus et al. |
| 9,065,017 B2 | 6/2015 | Reifenberg et al. |
| 2001/0002319 A1 | 5/2001 | Tauchi et al. |
| 2002/0175408 A1 | 11/2002 | Majumdar et al. |
| 2003/0041892 A1 | 3/2003 | Fleurial et al. |
| 2003/0099279 A1 | 5/2003 | Venkatasubramanian et al. |
| 2003/0184188 A1 | 10/2003 | Kucherov et al. |
| 2003/0189202 A1 | 10/2003 | Li et al. |
| 2004/0000333 A1 | 1/2004 | Chen et al. |
| 2004/0042181 A1 | 3/2004 | Nagasaki |
| 2004/0106203 A1 | 6/2004 | Stasiak et al. |
| 2004/0157354 A1 | 8/2004 | Kuriyama et al. |
| 2004/0161369 A1 | 8/2004 | Chan et al. |
| 2004/0251539 A1 | 12/2004 | Faris et al. |
| 2004/0261830 A1 * | 12/2004 | Sharp et al. ............... 136/201 |
| 2005/0045702 A1 * | 3/2005 | Freeman et al. ............... 228/254 |
| 2005/0060884 A1 | 3/2005 | Okamura |
| 2005/0064185 A1 | 3/2005 | Buretea et al. |
| 2005/0110064 A1 | 5/2005 | Duan et al. |
| 2005/0112872 A1 | 5/2005 | Okamura |
| 2005/0224790 A1 | 10/2005 | Jin et al. |
| 2005/0241690 A1 | 11/2005 | Tajima et al. |
| 2006/0000502 A1 | 1/2006 | Fiorini et al. |
| 2006/0017170 A1 | 1/2006 | Chen et al. |
| 2006/0053969 A1 | 3/2006 | Harada et al. |
| 2006/0076046 A1 | 4/2006 | Ghoshal et al. |
| 2006/0118158 A1 | 6/2006 | Zhang et al. |
| 2006/0118513 A1 | 6/2006 | Faure et al. |
| 2006/0151820 A1 | 7/2006 | Duan et al. |
| 2006/0157101 A1 | 7/2006 | Sakamoto et al. |
| 2006/0159916 A1 | 7/2006 | Dubrow et al. |
| 2006/0172116 A1 | 8/2006 | Den et al. |
| 2006/0179820 A1 | 8/2006 | Sullivan |
| 2006/0233692 A1 | 10/2006 | Scaringe et al. |
| 2006/0251561 A1 | 11/2006 | Farrell et al. |
| 2006/0254501 A1 | 11/2006 | Wang et al. |
| 2006/0266402 A1 | 11/2006 | Zhang et al. |
| 2007/0025658 A1 | 2/2007 | Fukai et al. |
| 2007/0095383 A1 | 5/2007 | Tajima |
| 2007/0128773 A1 | 6/2007 | Baskaran |
| 2007/0131269 A1 | 6/2007 | Dutta |
| 2007/0132043 A1 | 6/2007 | Bradley et al. |
| 2007/0261730 A1 | 11/2007 | Seker et al. |
| 2007/0290322 A1 | 12/2007 | Zhao et al. |
| 2008/0006843 A1 | 1/2008 | Dai et al. |
| 2008/0023057 A1 | 1/2008 | Nakajima et al. |
| 2008/0060695 A1 | 3/2008 | Brignone |
| 2008/0093698 A1 | 4/2008 | Tsakalakos et al. |
| 2008/0121263 A1 | 5/2008 | Schutte et al. |
| 2008/0142066 A1 | 6/2008 | Plissonnier et al. |
| 2008/0149914 A1 | 6/2008 | Samuelson et al. |
| 2008/0173344 A1 | 7/2008 | Zhang et al. |
| 2008/0178920 A1 | 7/2008 | Ullo |
| 2008/0178921 A1 | 7/2008 | Ye |
| 2008/0230802 A1 | 9/2008 | Bakkers et al. |
| 2008/0268233 A1 | 10/2008 | Lawin et al. |
| 2008/0299381 A1 | 12/2008 | Zhang et al. |
| 2008/0308140 A1 | 12/2008 | Nakamura |
| 2009/0004086 A1 | 1/2009 | Kuhling et al. |
| 2009/0020148 A1 | 1/2009 | Boukai et al. |
| 2009/0025771 A1 | 1/2009 | Stark |
| 2009/0096109 A1 | 4/2009 | Iwasaki |
| 2009/0117741 A1 | 5/2009 | Heath et al. |
| 2009/0140145 A1 | 6/2009 | Ouvrier-Buffet et al. |
| 2009/0174038 A1 | 7/2009 | Wang |
| 2009/0214848 A1 | 8/2009 | Sands |
| 2009/0236317 A1 | 9/2009 | Yost et al. |
| 2010/0011781 A1 | 1/2010 | Lents et al. |
| 2010/0068871 A1 | 3/2010 | Tian et al. |
| 2010/0072461 A1 | 3/2010 | Hannebauer |
| 2010/0078055 A1 | 4/2010 | Vidu et al. |
| 2010/0147350 A1 | 6/2010 | Chou |
| 2010/0147371 A1 | 6/2010 | Cho |
| 2010/0162728 A1 | 7/2010 | Lee |
| 2010/0167444 A1 | 7/2010 | Chen et al. |
| 2010/0233518 A1 | 9/2010 | Kwon et al. |
| 2010/0236595 A1 | 9/2010 | Bell et al. |
| 2010/0236596 A1 | 9/2010 | Lee et al. |
| 2010/0261013 A1 | 10/2010 | Duan et al. |
| 2010/0272993 A1 | 10/2010 | Volinsky et al. |
| 2010/0319759 A1 | 12/2010 | Fisher et al. |
| 2011/0000708 A1 | 1/2011 | Nakai et al. |
| 2011/0016888 A1 | 1/2011 | Haass et al. |
| 2011/0018155 A1 | 1/2011 | Stefan et al. |
| 2011/0020969 A1 | 1/2011 | Haas et al. |
| 2011/0059568 A1 | 3/2011 | Chao et al. |
| 2011/0065223 A1 | 3/2011 | Hannebauer |
| 2011/0114145 A1 | 5/2011 | Yang et al. |
| 2011/0114146 A1 | 5/2011 | Scullin |
| 2011/0168223 A1 | 7/2011 | Dede et al. |
| 2011/0204500 A1 | 8/2011 | Lim et al. |
| 2011/0233512 A1 | 9/2011 | Yang et al. |
| 2011/0252774 A1 | 10/2011 | Spieth et al. |
| 2011/0258995 A1 | 10/2011 | Limbeck et al. |
| 2011/0266521 A1 | 11/2011 | Ferrari et al. |
| 2011/0304004 A1 | 12/2011 | Park |
| 2012/0000500 A1 | 1/2012 | Iida et al. |
| 2012/0037591 A1 | 2/2012 | Tringe et al. |
| 2012/0040512 A1 | 2/2012 | Li et al. |
| 2012/0042661 A1 | 2/2012 | Danenberg et al. |
| 2012/0049315 A1 | 3/2012 | Kim et al. |
| 2012/0057305 A1 | 3/2012 | Morisaku et al. |
| 2012/0097206 A1 | 4/2012 | Sadaoka et al. |
| 2012/0098162 A1 | 4/2012 | Snyder et al. |
| 2012/0118343 A1 | 5/2012 | Iida et al. |
| 2012/0126449 A1 | 5/2012 | Hart et al. |
| 2012/0152294 A1 | 6/2012 | Kim et al. |
| 2012/0152295 A1 | 6/2012 | Matus et al. |
| 2012/0207641 A1 | 8/2012 | Rubio et al. |
| 2012/0247527 A1 | 10/2012 | Scullin et al. |
| 2012/0282435 A1 | 11/2012 | Yang et al. |
| 2012/0295074 A1 | 11/2012 | Yi et al. |
| 2012/0319082 A1 | 12/2012 | Yi et al. |
| 2013/0000688 A1 | 1/2013 | Cho et al. |
| 2013/0001480 A1 | 1/2013 | Malik et al. |
| 2013/0019918 A1 | 1/2013 | Boukai et al. |
| 2013/0037070 A1 | 2/2013 | Narducci et al. |
| 2013/0042899 A1 | 2/2013 | Wirtz et al. |
| 2013/0069194 A1 | 3/2013 | Marinescu et al. |
| 2013/0081662 A1 | 4/2013 | Dibra |
| 2013/0146116 A1 | 6/2013 | Jovovic et al. |

(56) References Cited

U.S. PATENT DOCUMENTS

| | | | |
|---|---|---|---|
| 2013/0161834 A1 | 6/2013 | Pan | |
| 2013/0175654 A1 | 7/2013 | Muckenhim et al. | |
| 2013/0186445 A1 | 7/2013 | Lorimer et al. | |
| 2013/0187130 A1 | 7/2013 | Matus et al. | |
| 2013/0199337 A1 | 8/2013 | Udono et al. | |
| 2013/0241026 A1 | 9/2013 | Or-Bach et al. | |
| 2013/0267046 A1 | 10/2013 | Or-Bach et al. | |
| 2014/0116491 A1 | 5/2014 | Reifenberg et al. | |
| 2014/0182644 A1 | 7/2014 | Aguirre et al. | |
| 2014/0193982 A1 | 7/2014 | Yi et al. | |
| 2014/0318588 A1 | 10/2014 | Kouma et al. | |
| 2014/0318593 A1 | 10/2014 | Venkatasubramanian et al. | |
| 2014/0329389 A1 | 11/2014 | Matus et al. | |
| 2015/0064830 A1 | 3/2015 | Reifenberg et al. | |

FOREIGN PATENT DOCUMENTS

| | | |
|---|---|---|
| CN | 101009214 | 8/2007 |
| CN | 101156255 | 4/2008 |
| EP | 0687020 | 12/1995 |
| EP | 1426756 | 6/2004 |
| JP | 2004-532133 | 10/2004 |
| JP | 2006-332188 | 12/2006 |
| JP | 2009/260173 | 11/2009 |
| JP | 5524839 | 4/2014 |
| RU | 2296055 | 11/2006 |
| WO | WO 00/08693 | 2/2000 |
| WO | WO 02/080280 | 10/2002 |
| WO | WO 2006/049285 | 5/2006 |
| WO | WO 2006/062582 | 6/2006 |
| WO | WO 2009/026466 | 2/2009 |
| WO | WO 2009/125317 | 10/2009 |
| WO | WO 2010/004550 | 1/2010 |
| WO | WO 2010/018893 | 2/2010 |
| WO | WO 2011/060149 | 5/2011 |
| WO | WO 2012/068426 | 5/2012 |
| WO | WO 2012/075359 | 6/2012 |
| WO | WO 2012/088085 | 6/2012 |
| WO | WO 2012/161757 | 11/2012 |
| WO | WO 2013/010547 | 1/2013 |
| WO | WO 2013/112710 | 8/2013 |
| WO | WO 2013/119755 | 8/2013 |
| WO | WO 2014/084315 | 6/2014 |
| WO | WO 2015/021467 | 2/2015 |

OTHER PUBLICATIONS

Asheghi et al., "Temperature-Dependent Thermal Conductivity of Single Crystal Silicon Layers in SOI Substrates," *J. Heat Transf.*, 120 (1998), pp. 30-36.
Brinson et al., "Thermal Conductivity and Thermoelectric Power of Heavily Doped N-Type Silicon," *J. Phys. C*, 3 (1970), pp. 483-491.
Cahill et al., "Thermal Conductivity of Amorphous Solids Above the Plateau," *Phys. Rev. B*, 35 (1987) pp. 4067-4073.
Chartier et al., "Metal-Assisted Chemical Etching of Silcon in IIF—II$_2$O$_2$," *Electrochmica Acta*, 53 (2008) pp. 5509-5516.
Chen et al., "Thermal Conductance of Thin Silicon Nanowires," *Physical Review Letters*, 101 (2008) pp. 105501-1-105501-4.
Chen et al., "Vertically-Aligned of Sub-Millimeter Ultralong Si Nanowire Arrays and Its Reduced Phonon Thermal Conductivity," *Journal of The Electrochemical Society*, 158:5 (2011) pp. D302-D306.
Chinese Patent Office, Office Action in CN Application No. 200880113050.3, mailed Aug. 26, 2013.
Chinese Patent Office, Office Action in CN Application No. 200880113050.3, mailed Mar. 5, 2013.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
Disalvo, F.J., "Thermoelectric Cooling and Power Generation," *Science*, 285 (1999), 703-706.
Douani et al., "Formation of a-SI:H and a-Si$_{1-x}$ C$_x$ :H Nanowires by Ag-Assisted Electroless Etching in Aqueous HF/AgNO$_3$ Solution," *Thin Solid Films*, 519 (2011) pp. 5383-5387.
Electron Microscopy Sciences, Colloidal Compounds and Conductive Adhesives, Jan. 25, 2011; Retrieved on Aug. 13, 2012 from the Internet <URL: http://web .archive.org/web/20110125172854/ http://emsdiasum.com/microscopy/products/sem/colloidal.aspx>. pp. 1-16.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
European Patent Office, Supplemental Search Report for EP Application No. 08827590, mailed Aug. 5, 2013.
European Patent Office, Extended European Search Report for EP Application No. 10163141, mailed Aug. 20, 2013.
Evanoff et al., "Synthesis and Optical Properties of Silver Nanoparticles and Arrays," *ChemPhysChem*, 6 (2005) pp. 1221-1231.
Fang et al., "Silver Catalysis in the Fabrication of Silicon Nanowire Arrays," *Nanotechnology*, 17 (2006) pp. 3768-3774.
Gao et al., "Selective Growth of Si Nanowire Arrays via Galvanic Displacement Processes in Water-in-Oil Microemulsions," *J. Am. Chem. Soc.*, 127 (2005) pp. 4574-4575.
Geballe et al., "Seebeck Effect in Silicon," *Phys. Rev.*, 98(4) (1955), pp. 940-947.
Gielis et al., "Silver-Assisted Electroless Etching of Si Nanowires," *Abstract #1971*, presented Oct 11, 2010 at the 218$^{th}$ ECS Meeting (held in Las Vegas, NV, Oct. 10-15, 2010).
Harman et al., "Quantum Dot Superlattice Thermoelectric Materials and Evices," *Science*, 297 (2002), pp. 2229-2232.
Heitsch et al., *J. Am. Chem. Soc.*, 130 (2008) pp. 5436-5437.
Hochbaum et al., "Controlled Growth of Si Nanowire Arrays for Device Integration," *Nano Letters*, 5(3) (2005) pp. 457-460.
Hochbaum et al., "Enhanced Thermoelectric Performance of Rough Silicon Nanowires," *Nature*, 451 (2008) pp. 163-167 (with full Methods attached from on-line version of this paper at www.nature.com/nature).
Hochbaum et al., "Single Crystalline Mesoporous Silicon Nanowires," *Nano Letters*, 9(10) (2009) pp. 3550- 3554.
Hsu et al., "Cubic AgPb$_m$SbTe$_{2+m}$: Bulk Thermoelectric Materials with High Figure of Merit," *Science*, 303 (2004), pp. 818-821.
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.
Japanese Patent Office, Office Action in JP Application No. 2010-522040, mailed Mar. 5, 2013.
Japanese Patent Office, Office Action in JP Application No. 2010-522040, mailed Oct. 15, 2013.
Ju et al., "Phonon Scattering in Silicon Films with Thickness of Order 100 nm," *Appl. Phys. Lett.*, 74(20) (1999), pp. 3005-3007.
Kim et al., "Thermal Conductivity Reduction and Thermoelectric Figure of Merit Increase by Embedding Nanoparticles in Crystalline Semiconductors," *Phys. Rev. Lett.*, 96 (2006), pp. 045901-1-045901-4.
Li et al., "Thermal Conductivity of Individual Silicon Nanowires," *Appl. Phys. Lett.*, 83(14) (2003), pp. 2934-2936.
Majumdar, A., "Thermoelectricity in Semiconductor Nanostructures," *Science*, 303 (2004), pp. 777-778.
Morinaga et al., "Mechanism of Metallic Particle Growth and Metal-Induced Pitting on Si Wafer Surface in Wet Chemical Process," *J Electrochem. Soc.*, 141(10) (1994) pp. 2834-2841.
Nahm et al., "Mechanism of Silicon Etching in HF—KMnO$_4$-H$_2$O Solution," *Korean J. of Chem. Eng.*, 12(2) (1995) pp. 162-167.
Parkhutik, V.P., "Oscillations of Open-Circuit Potential During Immersion Plating of Silicon in CuSo$_4$/HF Solutions," *Russian Journal of Electrochemistry*, 42(5) (2006) pp. 512-522.
Patent Cooperation Treaty, International Search Report for application PCT/US2010/056356, mailed Jun. 3, 2011.
Patent Cooperation Treaty, International Search Report for application PCT/US2011/061301, mailed Jan. 31, 2013.

(56) References Cited

OTHER PUBLICATIONS

Patent Cooperation Treaty, International Search Report for application PCT/US2011/63000, mailed Apr. 3, 2012.
Patent Cooperation Treaty, International Search Report for application PCT/US2011/066108, mailed Apr. 26, 2012.
Patent Cooperation Treaty, International Search Report for application PCT/US2012/023425, mailed Sep. 4, 2012.
Patent Cooperation Treaty, International Search Report for application PCT/US2013/025060, mailed Apr. 15, 2013.
Patent Cooperation Treaty, International Search Report for PCT/US08/73922, mailed Dec. 23, 2008.
Patent Cooperation Treaty, International Search Report, mailed May 28, 2013, in Application No. PCT/US2013/022930.
Patent Cooperation Treaty, International Search Report, mailed Mar. 10, 2014, in Application No. PCT/US2013/064812.
Patent Cooperation Treaty, Written Opinion for PCT/US08/73922, mailed Dec. 23, 2008.
Patent Cooperation Treaty, Written Opinion of the International Searching Authority for application PCT/US2010/056356, mailed Jun. 3, 2011.
Patent Cooperation Treaty, Written Opinion of the International Searching Authority for application PCT/US2011/061301, mailed Jan. 31, 2013.
Patent Cooperation Treaty, Written Opinion of the International Searching Authority for application PCT/US2011/63000, mailed Apr. 3, 2012.
Patent Cooperation Treaty, Written Opinion of the International Searching Authority for application PCT/US2011/066108, mailed Apr. 26, 2012.
Patent Cooperation Treaty, Written Opinion of the International Searching Authority for application PCT/US2012/023425, mailed Sep. 4, 2012.
Patent Cooperation Treaty, Written Opinion of the International Searching Authority for application PCT/US2013/025060, mailed Apr. 15, 2013.
Patent Cooperation Treaty, Written Opinion, mailed Mar. 10, 2014, in Application No. PCT/US2013/064812.
Patent Cooperation Treaty, Written Opinion, mailed May 28, 2013, in Application No. PCT/US2013/022930.
Peng et al., "Aligned Single-Crystalline Si Nanowire Arrays for Photovoltaic Applications," *Small*, 1(11), (2005), pp. 1062-1067.
Peng et al., "Aligned Single-Crystalline Si Nanowire Arrays for Photovoltaic Applications," *Small*, 1(11), (2005), pp. 1062-1067, with three additional pages of "Supporting Information."
Peng et al., "Dendrite-Assisted Growth of Silicon Nanowires in Electroless Metal Deposition," *Advanced Functional Materials*, 13(2) (2003) pp. 127-132.
Peng et al., "Motility of Metal Nanoparticles in Silicon and Induced Anisotropic Silicon Etching," *Advanced Functional Materials*, 18 (2008) pp. 3026-3035.
Peng et al., "Synthesis of Large-Area Silicon Nanowire Arrays via Self-Assembling Nanoelectrochemistry," *Adv. Mater.*, 14(16) (2002) pp. 1164-1167.
Peng et al., "Uniform, Axial-Orientation Alignment of One-Dimensional Single-Crystal Silicon Nanostructure Arrays," *Angew. Chem. Int. Ed.*, 44 (2005) pp. 2737-2742.
Rokugawa et al., "An Etchant System, $Ag_2CrO_4$—HF—$H_2O$, for Highly Aligned Si Nanowire Fabrication," *Journal of the Electrochemical Society*, 157(8) (2010), pp. K157-K161.
Ruf et al., "Thermal Conductivity of Isotopically Enriched Silicon," *Solid State Commun.*, 115 (2000), pp. 243- 247.
Russian Patent Office, Office Action in RU Application No. 2010110307/04, mailed Jun. 1, 2012.
Russian Patent Office, Resolution on Granting Patent for Invention in RU Application No. 2010110307/04, mailed Sep. 11, 2013.
Rutten et al., "The Electrochemical Reduction of Nitrate in Acidic Nitrate Solutions," *Journal of Applied Electrochemistry*, 29 (1999) pp. 87-92.

Siii et al., "Measuring Termal and Thermoelectric Properties of One-Dimensional Nanostructures Using a Microfabricated Device," *J. Heat Transf.*, 125 (2003), pp. 881-888.
Sivakov et al., "Realization of Vertical and Zigzag Single Crystalline Silicon Nanowire Architectures," *J. Phys. Chem. C*, 114 (2010) pp. 3798-3803.
Tang et al., "Holey Silicon as an Efficient Thermoelectric Material," *Nano Lett.*, 10 (2010), pp. 4279-4283.
Tao et al., "Langmuir-Blodgett Silver Nanowire Monolayers for Molecular Sensing Using Surface-Enhanced Raman Spectroscopy," *Nano. Lett.* 3, (2003), pp. 1229-1233.
United States Patent and Trademark Office, Advisory Action issued in U.S. Appl. No. 12/673,366, mailed Nov. 27, 2013.
United States Patent and Trademark Office, Office Action issued in U.S. Appl. No. 12/673,366, mailed May 1, 2013.
United States Patent and Trademark Office, Office Action issued in U.S. Appl. No. 12/673,366, mailed Sep. 26, 2013.
United States Patent and Trademark Office, Office Action issued in U.S. Appl. No. 12/943,134, mailed Nov. 18, 2013.
United States Patent and Trademark Office, Office Action issued in U.S. Appl. No. 13/308,945, mailed Aug. 2, 2013.
United States Patent and Trademark Office, Notice of Allowance issued in U.S. Appl. No. 13/308,945, mailed Dec. 11, 2013.
United States Patent and Trademark Office, Office Action issued in U.S. Appl. No. 13/364,176, mailed Jan. 27, 2014.
United States Patent and Trademark Office, Office Action issued in U.S. Appl. No. 13/760,977, mailed Apr. 1, 2014.
Van Herwaarden, A.W., "The Seebeck Effect in Silicon ICs.," *Sensors and Actuators*, 6 (1984), pp. 245-254.
Venkatasubramanian et al., "Thin-film Thermoelectric Devices with High Room-Temperature Figures of Merit," *Nature*, 413 (2001), pp. 597-602.
Wang et al., "Complementary Symmetry Silicon Nanowire Logic: Power-Efficient Inverters with Gain," *Small*, 2(10), (2006), pp. 1153-1158.
Weber et al., "Transport Properties of Silicon," *Appl. Phys. A*. 53, (1991), 136-140.
Weiss et al., "Nanoparticle-Textured Surfaces from Spin Coating," *Langmuir*, 24 (2008) pp. 5218-5220.
Wilson, "Thermal Conductivity of Solders," Electronics-cooling.com [retrieved online on Jan. 23, 2014], from the Internet <URL: http://www.electronics-cooling.com/2006/08/thermal-conductivity-of-solders/>, pp. 1-3.
Yoo et al., "Thermal Conductivity of Al2O3/Water Nanofluids," *Journal of the Korean Physical Society*, 51 (Oct. 2007), pp. S84-S87.
Zandi et al., "Study of Bulk Micromachining for < 100> Silicon," *Eur. Phys. J. Appl. Phys.*, 35 (2006) pp. 7-12.
Zhang et al., "Synthesis of Ordered Single Crystal Silicon Nanowire Arrays," *Adv. Mater.*, 13 (2001), 1238.
Zou et al., "Phonon Heat Conduction in a Semiconductor Nanowire," *J App. Phys.*, 89(5) (2001) pp. 2932-2938.
European Patent Office, Extended European Search Report for EP Application No. 11845164.0, mailed Nov. 11, 2014.
Sakamoto et al., "The Use of Transition-Metal Silicides to Reduce the Contact Resistance Between the Electrode and Sintered *n*-Type Mg2Si," J. Electronic Materials 41(6):1805-1810 (2012).
Sakamoto et al., "Formation of Ni Electrodes on Sintered N-type Mg2Si Using Monobloc Sintering and Electroless Plating Methods." AIP Conf. Proc., 1449:223-226 (2012).
Wang et al., "A new type of low power thermoelectric micro-generator fabricated by nanowire array thermoelectric material," Microelectronic Engineering 77(3-4): 223-229 (Apr. 1, 2005).
United States Patent and Trademark Office, Notice of Allowance issued in U.S. Appl. No. 13/786,090, mailed Oct. 9, 2014.
United States Patent and Trademark Office, Notice of Allowance issued in U.S. Appl. No. 14/203,360, mailed Sep. 18, 2014.
Bell, "Cooling, heating, generating power, and recovering waste heat with thermoelectric systems," Science, vol. 321, pp. 1457-1461, Sep. 12, 2008.
Ben-Chorin et al., "Hopping transport on a fractal: ac conductivity of porous silicon," Physical Review B, vol. 51, No. 4, pp. 2199-2213, Jan. 15, 1995.

(56) References Cited

OTHER PUBLICATIONS

Boukai et al, "Silicon nanowires as efficient thermoelectric materials," Nature, vol. 451, Jan. 10, 2000.
Bux et al., "Nanostructured bulk silicon as an effective thermoelectric material," Advanced Functional Materials 2009, 19, 2445-2452.
Cahill et al., "Lower limit to the thermal conductivity of disordered crystals," Physical Review B, vol. 46, No. 10, pp. 6131-6140, Sep. 1, 1992.
Cheng et al., "Fabrication of Vertically Aligned Silicon Nanowire Arrays and Investigation on the Formation of the Nickel Silicide Nanowires," presented at the 2007 IEEE Conference on Electron Devices and Solid-State Circuit held Dec. 20-22, 2007, *IEEE Service Center*, 2007, pp. 121-124.
Chiritescu et al., "Ultralow thermal conductivity in disordered, layered $WSe_2$ crystals," Science, vol. 315, pp. 351-353, Jan. 19, 2007.
Cui, "High performance silicon nanowire field effect transistors," Nano Letters, 2003, vol. 3, No. 2 pp. 149-152, Nov. 1, 2002.
Gesele et al., "Temperature-dependent thermal conductivity of porous silicon," J. Phys. D: Appl. Phys. 30 (1997) 2911-2916, May 19, 1997.
Haick et al., "Electrical characteristics and chemical stability of non-oxidized, methyl-terminated silicon nanowires," J. Am. Chem. Soc. 2006, 128, 8990-8991, Oct. 4, 2005.
Hao et al., "Frequency-dependent Monte Carlo simulations of phonon transport in two-dimensional porous silicon with aligned pores," Journal of Applied Physics 106, 114321 (2009), Dec. 15, 2009.
Majumdar, A., "Lower limit of thermal conductivity: diffusion versus localization," Technical Discussion, Microscale Thermophysical Engineering, 2:5-9, 1998, © 1998 Taylor & Francis 1089-3954/98.
Masetti et al., "Modeling of Carrier Mobility Against Carrier Concentration in Arsenic-, Phosphorus-, and Boron-Doped Silicon," IEEE Transactions on Electron Device, 30(7):764-769 (1983).
Mathur et al., "Thermoelectric power in porous silicon," Journal of Applied Physics, vol. 83, No. 11, pp. 5855-5857, Jun. 1, 1998.
Park et al., "Fabrication of highly ordered silicon oxide dots and stripes from block copolymer thin films," Advanced Materials 2008, 20, 681-685.
Snyder et al., "Complex thermoelectric materials," Nature Materials, vol. 7, pp. 105-112, Feb. 2008.
Swartz et al., "Thermal boundary resistance," Reviews of Modern Physics, vol. 61, No. 3, pp. 605-668, Jul. 1989.
Tang et al., "Holey Silicon as an Efficient Thermoelectric Material JIB-2854," abstract, Lawrence Berkeley National Laboratory, Apr. 8, 2011. Downloaded from http://lbl.gov.Tech-Transfer/techs/lbn12854.html on Apr. 14, 2011 (one page).
Tritt et al., "Thermoelectrics: Direct solar thermal energy conversion," MRS Bulletin, vol. 33, Apr. 2008.
Vazquez-Mena et al., "Metallic nanowires by full wafer stencil lithography," Nano Letters, 2008, vol. 8, No. 11, 3675-3682, Aug. 11, 2008.
Yamamoto et al., "Thermoelectric transport properties of porous silicon nanostructure," 18th International Conference on Thermoelectrics (1999), © 2000 IEEE 0-7803-5451-6/00.
Yang et al., "Thermoelectric materials for space and automotive power generation," MRS Bulletin, vol. 31, pp. 224-229, Mar. 2006.
European Patent Office, Extended European Search Report for EP Application No. 11845164.0, mailed Nov. 6, 2014.
European Patent Office, Extended European Search Report for EP Application No. 11841453.1, mailed Nov. 28, 2014.
European Patent Office, Extended European Search Report for EP Application No. 10830715.8, mailed Jun. 10, 2014.
Patent Cooperation Treaty, International Search Report, mailed Jan. 27, 2015, in Application No. PCT/US2014/053102.
Patent Cooperation Treaty, Written Opinion, mailed Jan. 27, 2015, in Application No. PCT/US2014/053102.
United States Patent and Trademark Office, Office Action issued in , U.S. Appl. No. 13/430,558, mailed Jan. 30, 2015.
United States Patent and Trademark Office, Office Action issued in U.S. Appl. No. 12/943,134, mailed May 22, 2014.
United States Patent and Trademark Office, Office Action issued in U.S. Appl. No. 12/943,134, mailed Jan. 21, 2015.
United States Patent and Trademark Office, Office Action issued in U.S. Appl. No. 13/299,179, mailed Feb. 26, 2015.
United States Patent and Trademark Office, Office Action issued in U.S. Appl. No. 13/331,768, mailed Jan. 20, 2015.
United States Patent and Trademark Office, Office Action issued in U.S. Appl. No. 13/760,977, mailed Dec. 2, 2014.
United States Patent and Trademark Office, Notice of Allowance issued in U.S. Appl. No. 13/786,090, mailed Feb. 9, 2015.
United States Patent and Trademark Office, Notice of Allowance issued in U.S. Appl. No. 14/059,362, mailed Jan. 8, 2015.
United States Patent and Trademark Office, Office Action issued in U.S. Appl. No. 14/203,360, mailed Jan. 26, 2015.
United States Patent and Trademark Office, Notice of Allowance issued in U.S. Appl. No. 14/469,404, mailed Feb. 23, 2015.
Kolasinski, Kurt W., "Silicon Nanostructures from Electroless Electrochemical Etching," Current Opinion in Solid State and Materials Science, 9(1-2), (2005), pp. 73-83.
United States Patent and Trademark Office, Office Action issued in U.S. Appl. No. 13/430,558, mailed Apr. 24, 2014.
United States Patent and Trademark Office, Corrected Notice of Allowability issued in U.S. Appl. No. 13/308,945, mailed Apr. 24, 2014.
United States Patent and Trademark Office, Final Office Action issued in U.S. Appl. No. 13/364,176, mailed Sep. 8, 2014.
United States Patent and Trademark Office, Office Action issued in U.S. Appl. No. 14/203,360, mailed Jun. 10, 2014.
Benecke et al., "MEMS Applications of Porous Silicon," Proc. SPIE 4592, Device and Process Technologies for MEMS and Microelectronics II, 76: doi:10.1117/12.449009, 12 pages (Nov. 21, 2011).
Bogush et al., "Preparation of monodisperse silica particles: Control of size and mass fraction," Journal of Non-Crystalline Solids 104: 95-106 (1988).
Chen et al., "Dispenser-printed thick film thermoelectric materials," Proceedings of PowerMEMS Conference, 2010 (Dec.), pp. 223-226.
Chen et al., "Wafer-scale synthesis of single-crystal zigzag silicon nanowire arrays with controlled turning angles," Nano Lett. 10: 864-868 (2010).
Chiappini et al., "Biodegradable porous silicon barcode nanowires with defined geometry," Adv. Funct. Mater. 20: 2231-2239 (2010).
Goncalves et al., "Fabrication of flexible thermoelectric microcoolers using planar thin film technologies," J. Micromec. Microeng. 17: S168-S173 (2007).
Huang et al., "Metal-assisted chemical etching of silicon: A review," Adv. Mater. 23: 285-308 (2011).
Huang et al., "Oxidation rate effect on the direction of metal-assisted chemical and electrochemical etching of silicon," J. Phys. Chem. C 114: 10683-10690 (2010).
Huang et al., "Synthesis of uniform, spherical sub-100 nm silica particles using a conceptual modification of the classic LaMer model," Colloids and Surfaces A: Physicochem. Eng. Aspects 360: 175-183 (2010).
Kim et al., "Curved silicon nanowires with ribbon-like cross sections by metal-assisted chemical etching," ACS Nano 5(6): 5242-5248 (2011).
Kim et al., "Thermal Transport Properties of Thin Films of Small Molecule Organic Semiconductors," Applied Physics Letters, 87: 241908 (2005), 3 pages.
Lee et al., "Scalable nanopillar arrays with layer-by-layer patterned overt and covert images," Adv. Mater. 26: 6119-6124 (2014).
Peng et al., "Fabrication of single-crystalline silicon nanowires by scratching a silicon surface with catalytic metal particles," Adv. Funct. Mater. 16: 387-394 (2006).
Ryckman et al., "Direct imprinting of porous substrates: A rapid and low-cost approach for patterning porous nanomaterials," Nano Lett.: dx.doi/10.1021/nl1028073, 6 pages (2010).
Sailor, "Fundamentals of Porous Silicon Preparation," Chapter 1, pp. 1-42, Porous Silicon in Practice: Preparation, Characterization and Applications, First Edition, Wiley-VCH Verlag GmbH & Co. KGaA (2012).
Stewart et al., "Nanostructured Plasmonic Sensors," Chem. Rev. 108:494-521 (2008).

(56) References Cited

OTHER PUBLICATIONS

Stober et al., "Controlled growth of monodisperse silica spheres in the micron size range," Journal of Colloid and Interface Science 26: 62-69 (1968).
United States Patent and Trademark Office, Office Action issued in U.S. Appl. No. 13/749,470, mailed Apr. 21, 2015.
United States Patent and Trademark Office, Office Action issued in U.S. Appl. No. 14/226,569, mailed Jun. 8, 2015.
United States Patent and Trademark Office, Office Action issued in U.S. Appl. No. 13/760,977, mailed Jun. 17, 2015.
United States Patent and Trademark Office, Notice of Allowance issued in U.S. Appl. No. 14/333,197, mailed May 1, 2015.
United States Patent and Trademark Office, Office Action issued in U.S. Appl. No. 13/364,176, mailed Apr. 29, 2015.
United States Patent and Trademark Office, Corrected Notice of Allowability issued in U.S. Appl. No. 13/786,090, mailed Mar. 3, 2015.
United States Patent and Trademark Office, Notice of Allowance issued in U.S. Appl. No. 14/059,362, mailed Mar. 6, 2015.
United States Patent and Trademark Office, Office Action issued in U.S. Appl. No. 12/943,134, mailed Sep. 25, 2015.
United States Patent and Trademark Office, Notice of Allowance issued in U.S. Appl. No. 13/299,179, mailed Sep. 23, 2015.
Chinese Patent Office, Office Action in CN Application No. 201180065569.0, mailed Aug. 3, 2015.
Patent Cooperation Treaty, International Search Report for application PCT/US2015/025075, mailed Aug. 4, 2015.
Patent Cooperation Treaty, International Search Report, mailed Jul. 23, 2015, in Application No. PCT/US2015/024484.
Patent Cooperation Treaty, Written Opinion of the International Searching Authority for application PCT/US2015/025075, mailed Aug. 4, 2015.
Patent Cooperation Treaty, Written Opinion, mailed Jul. 23, 2015, in Application No. PCT/US2015/024484.
United States Patent and Trademark Office, Notice of Allowance issued in U.S. Appl. No. 14/203,360, mailed Jul. 21, 2015.
United States Patent and Trademark Office, Notice of Allowance issued in U.S. Appl. No. 14/333,197, mailed Aug. 18, 2015.
United States Patent and Trademark Office, Office Action issued in U.S. Appl. No. 13/430,558, mailed Jun. 29, 2015.
Austrailian Patent Office, Patent Examination Report, Mailed Nov. 11, 2011 in Application No. 2013212087.
Chinese Patent Office, Office Action issued in Application No. 201280016754.5 mailed Sep. 6, 2015.
European Patent Office, Extended European Search Report for EP Application No. 12790253.4, mailed Sep. 29, 2015.
United States Patent and Trademark Office, Notice of Allowance issued in U.S. Appl. No. 14/226,569, mailed Oct. 26, 2015.
United States Patent and Trademark Office, OfficeAction issued in U.S. Appl. No. 13/331,768, mailed Oct. 6, 2015.
United States Patent and Trademark Office, Office Action issued in U.S. Appl. No. 13/364,176, mailed Oct. 20, 2015.
United States Patent and Trademark Office, Notice of Allowance issued in U.S. Appl. No. 14/203,360, Mailed Oct. 26, 2015.

* cited by examiner

METHOD AND STRUCTURE FOR THERMOELECTRIC UNICOUPLE ASSEMBLY

1. CROSS-REFERENCES TO RELATED APPLICATIONS

This application claims priority to U.S. Provisional Application No. 61/674,816, filed Jul. 23, 2012, commonly assigned and incorporated by reference herein for all purposes.

Additionally, this application is related to U.S. patent application Ser. No. 12/943,134 and Ser. No. 13/299,179, and U.S. Provisional Application No. 61/597,254 and No. 61/607,739, which are incorporated by reference herein for all purposes.

2. BACKGROUND OF THE INVENTION

The present invention is directed to thermoelectric module assembly. More particularly, the invention provides a method for forming an assembly in series of thermoelectric (TE) unicouples. Merely by way of example, the invention has been applied for sizing and assembling silicon-based thermoelectric unicouples bonded thermally in parallel and electrically in series with silicon-based contact wafers and heat sinks to form a 3D package of thermoelectric modules capable of generating electrical energy from high temperature waste heat. It would be recognized that the invention has a much broader range of applicability without limiting to specific material based TE unicouples, in various fields including but not limited to automobile combustion, industrial hot exhaust, nuclear power plants, and aircraft turbines.

An actual thermoelectric device must transport significant amounts of current from one electrode to another in the case of power generation, where a temperature gradient is applied to the thermoelectric material and the Seebeck effect is employed to drive a gradient in voltage and in turn the flow of electrical current. Conversely, an actual thermoelectric device used for refrigeration must carry an appreciable amount of heat with an applied electric current by way of the Peltier effect. In both of these thermoelectric device configurations, the thermoelectric figure of merit ZT of the thermoelectric material is one indicator of the material's efficiency in either converting heat to electricity (Seebeck effect, or thermopower) or pumping heat with electricity (Peltier effect).

In a thermoelectric device, electrodes must be placed on either ends of a thermoelectric material in order to collect current from it or transmit current through it. These electrodes must be made such that they form low resistance electrical and thermal contact to the thermoelectric material with high ZT value, and furthermore allow each TE "leg," or single element of either p-type or n-type semiconductor material, to be wired together among other TE legs and external circuitry. A TE unicouple (or simply referred as "unicouple") is a building block used for assembling an actual thermoelectric device with corresponding electrodes. In particular, the unicouple is a three-dimensional structure comprising a first conductive shunt material coupled on a hot side of a p-type thermoelectric leg and an n-type thermoelectric leg and a second conductive shunt material coupled to a cold side of either one or the p-type thermoelectric leg or the n-type thermoelectric leg.

Many efforts for improving thermoelectrics have been made to search for new advanced thermoelectric materials with high ZT value, to determine optimum unicouple structure associated with the thermoelectric material, and to develop feasible processes for forming the unicouples and assembling them to thermoelectric devices. Conventional high ZT thermoelectric materials such as bismuth telluride ($Bi_2Te_3$), either in bulk or nanostructured form or alloy form combined with other materials (Ce, Fe, Sb, etc.), have been used in some thermoelectric applications. However, other than the high cost and complexity of manufacturing these materials, which also have toxic characteristics, the poor high-temperature adaptability of such thermoelectric materials also substantially limits these devices to applications in relatively low temperature environments. This drives efforts in research and development on advanced, low-cost, silicon-based TE unicouples for assembling a thermoelectric module that can be used for wide range of temperatures, especially for waste-heat power generation application at high temperature greater than 600° C. as well as refrigeration application for electronic system.

3. BRIEF SUMMARY OF THE INVENTION

The present invention is directed to thermoelectric module assembly. More particularly, the invention provides a method for forming an assembly in series of thermoelectric (TE) unicouples. Merely by way of example, the invention has been applied for sizing and assembling silicon-based thermoelectric unicouples bonded thermally in parallel and electrically in series with silicon-based contact wafers and heat sinks to form a 3D package of thermoelectric modules capable of generating electrical energy from high temperature waste heat. It would be recognized that the invention has a much broader range of applicability without limiting to specific material based TE unicouples, in various fields including but not limited to automobile combustion, industrial hot exhaust, nuclear power plants, and aircraft turbines.

According to one or more embodiments of the present invention, methods are provided for assembling the thermoelectric unicouples in a series configuration based on silicon wafer processing technology although the method should be applicable to assemble suitably metalized legs of bismuth telluride or other TE materials. The method includes processes of determining optimum sizes of individual n-type or p-type thermoelectric leg, forming p-n singulated unicouples, picking up and re-disposing the singulated unicouples thermally in parallel and electrically in series with pre-determined spacing and arrangement, and bonding the unicouples with metalized shunts and further coupling the shunts with thermally matched heat sinks.

In a specific embodiment, the present invention provides a method for assembling a plurality of thermoelectric unicouples. The method includes providing a plurality of blocks with a rectangular shape having a width and a length made by either n-type or p-type thermoelectric functional semiconductor material. The method further includes disposing the plurality of blocks on a first shunt wafer in a 2D array wherein each n-type block is alternately disposed next to a p-type block. Additionally, the method includes performing a first cutting operation along the length of the block to reduce the width of each block and increase a gap spacing between two neighboring blocks while substantially free from removing any material of the first shunt wafer. The method further includes performing a second cutting operation along the width of each block through the first shunt wafer below to divide each block along the length into a column of multiple units; furthermore; the method includes performing a third cutting operation along middle line of each column of multiple units through the first shunt wafer below to further cut each unit into two thermoelectric functional legs respectively attached on two separate remaining pieces of the first shunt wafer. The combination of the first cutting operation, the second cutting operation, and the third cutting operation causes a formation of a plurality of singulated unicouples. Each singulated unicouple is made of a n-type thermoelectric functional leg attached at one end and a p-type thermoelectric functional leg attached at another end of a same remaining piece of the first shunt wafer. The method also includes re-arranging the plurality of singulated unicouples in one or more serial chains by bonding the remaining piece of the first shunt wafer of each singulated unicouple onto a first base plate such that every singulated unicouple in the serial chain comprises a same spatial orientation of a n-type thermoelectric functional leg on one end and a p-type thermoelectric functional leg on other end of a same piece of the first shunt wafer. The method continues to include bonding a second shunt wafer onto the n-type thermoelectric functional leg and the p-type thermoelectric functional leg of each singulated unicouple in the one or more serial chains. Moreover, the method includes performing a fourth cutting operation to remove material of the second shunt wafer partially from regions beyond two longitudinal edges of each serial chain and regions between the n-type thermoelectric functional leg and the p-type thermoelectric functional leg of each singulated unicouple while substantially free from removing any material of the first shunt wafer and the first base plate. The method further includes attaching a second base plate from above to bond each and every remaining piece of the second shunt wafer.

In another specific embodiment, the present invention provides a method for assembling thermoelectric unicouples to form a thermoelectric module. The method includes disposing a plurality of thermoelectric blocks with either n-type or p-type semiconductor characteristic onto a first shunt wafer. The method further includes resizing the plurality of thermoelectric blocks and a gap spacing between a n-type block and a p-type block without removing any material from the first shunt wafer. Additionally, the method includes removing partially materials of the thermoelectric block and the first shunt wafer along a middle region of each thermoelectric block to form a plurality of singulated unicouples comprising a separate partial piece of the first shunt wafer with a n-type thermoelectric leg attached on one end and a p-type thermoelectric leg attached on another end. The method further includes rearranging the plurality of singulated unicouples to form one or more daisy chains on a first heat sink plate. Each singulated unicouple within each of the one or more daisy chains has a same spatial orientation of the n-type thermoelectric leg and the p-type thermoelectric leg and is disposed at a predetermined space from a neighboring singulated unicouple. Furthermore, the method includes bonding a second shunt wafer onto the plurality of singulated unicouples. The method further includes resizing the second shunt wafer to retain a partial piece of the second shunt wafer connecting the n-type thermoelectric leg of one singulated unicouple with the p-type thermoelectric leg of the neighboring singulated unicouple. Moreover, the method includes attaching a second heat sink plate onto each retained partial piece of the second shunt wafer.

In yet another specific embodiment, a method for forming a plurality of singulated unicouples for assembling a thermoelectric module is provided. The method includes providing a plurality of blocks with a rectangular shape having a width and a length made by either n-type or p-type thermoelectric functional semiconductor material. Additionally, the method includes disposing the plurality of blocks on a conductive shunt wafer in a 2D array wherein each n-type block is alternately disposed next to a p-type block. The method further includes performing a first cutting operation along the length of the block to reduce the width of each block and increase a gap spacing between two neighboring blocks while substantially free from removing any material of the conductive shunt wafer. Furthermore, the method includes performing a second cutting operation along the width of each block through the conductive shunt wafer below to divide each block along the length into a column of multiple units. Moreover, the method includes performing a third cutting operation along middle line of each column of multiple units through the conductive shunt wafer below to further cut each unit into two thermoelectric functional legs respectively attached on two separate remaining pieces of the conductive shunt wafer, thereby forming a plurality of singulated unicouples each comprising a n-type thermoelectric functional leg attached at one end and a p-type thermoelectric functional leg attached at another end of a same remaining piece of the conductive shunt wafer.

In still another specific embodiment, a method for assembling a plurality of singulated unicouples to form a thermoelectric module is provided. The method includes providing a plurality of singulated unicouples. Each singulated unicouple is formed with a n-type thermoelectric functional leg and a p-type thermoelectric functional leg respectively attached to two ends of a stripe-shaped piece of a first shunt material. The method further includes arranging the plurality of singulated unicouples in one or more serial chains by bonding each piece of the first shunt material onto a first base plate, each serial chain comprising a same spatial orientation such that the n-type thermoelectric functional leg of a singulated unicouple is spatially opposed to a p-type thermoelectric functional leg of a next singulated unicouple with a predetermined spacing. Additionally, the method includes bonding a wafer piece of a second shunt material from above with each of the plurality of singulated unicouples in the one or more serial chains. Furthermore, the method includes performing a cutting operation to remove the second shunt material partially from regions beyond two longitudinal edges of each serial chain and regions between the n-type thermoelectric functional leg and the p-type thermoelectric functional leg of each singulated unicouple while substantially free from removing any first shunt material and the first base plate. Moreover, the method includes attaching a second base plate from above to bond with each and every remaining piece of the second shunt material.

The Si-based TE material can be fabricated directly out of a silicon wafer material to bear high-ZT characteristics. It is desirable to transform as much as possible of a starting wafer material into functionalized thermoelectric units. The ultimate commercial performance, and therefore usefulness, of a power generation thermoelectric is governed by its cost-per-Watt. It is beneficial to process a single piece of material, for example, a silicon wafer, in such a fashion as its use as a thermoelectric is maximized, since processing steps for most two-dimensional semiconductor material or the like cost the same amount regardless of the material thickness. In a specific embodiment, the Si-based TE units with high-ZT characteristics can be realized by transforming bulk crystal silicon material into nanostructured material. More details on methods for forming the bulk-sized nano-structured TE material units, including array of nanowires, nanoholes, or nano-porous blocks and transforming these nanostructures to form thermoelectric elements from a finite silicon wafer can be found in U.S. patent application Ser. No. 12/943,134 and Ser. No. 13/299,179, and U.S. Provisional Application No.

61/597,254 and No. 61/607,739, commonly assigned to Alphabet Energy, Inc. of Hayward, Calif., incorporated as references for all purposes.

4. BRIEF DESCRIPTION OF THE DRAWINGS

Figure 2:
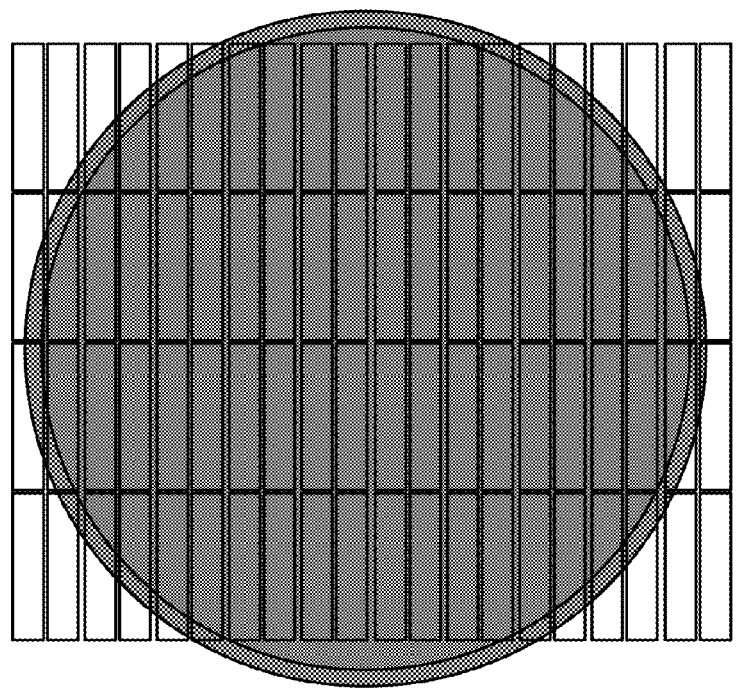

FIG. 2 schematically shows one or more steps of a method for forming a plurality of thermoelectric unicouples by cutting a wafer with basic thermoelectric material to proper sized blocks according to an embodiment of the present invention.

Figure 2A:
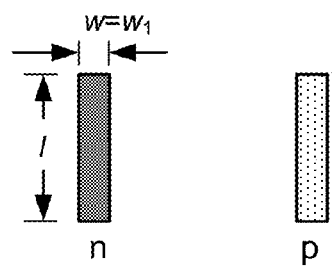

FIG. 2A schematically shows two cut blocks respectively bearing a n-type and a p-type semiconductor characteristics from corresponding wafers according to a specific embodiment of the present invention.

Figure 3:
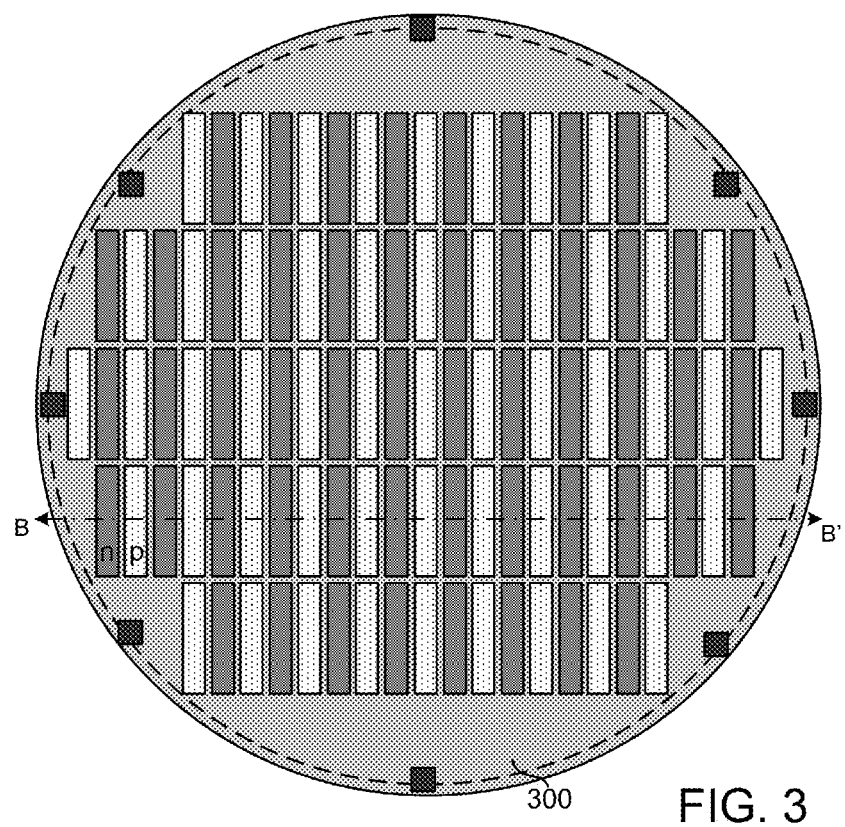

FIG. 3 schematically shows one or more steps of the method for assembling thermoelectric module according to an embodiment of the present invention.

Figure 3A:
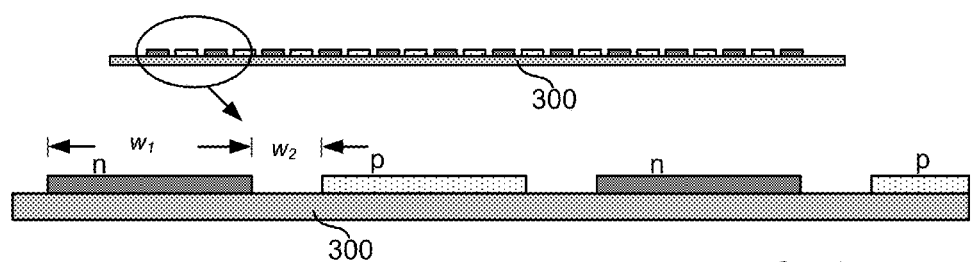

FIG. 3A is a cross-sectional view of FIG. 3 including a closer view of local structures of the thermoelectric module assembly according to an embodiment of the present invention.

Figure 4:
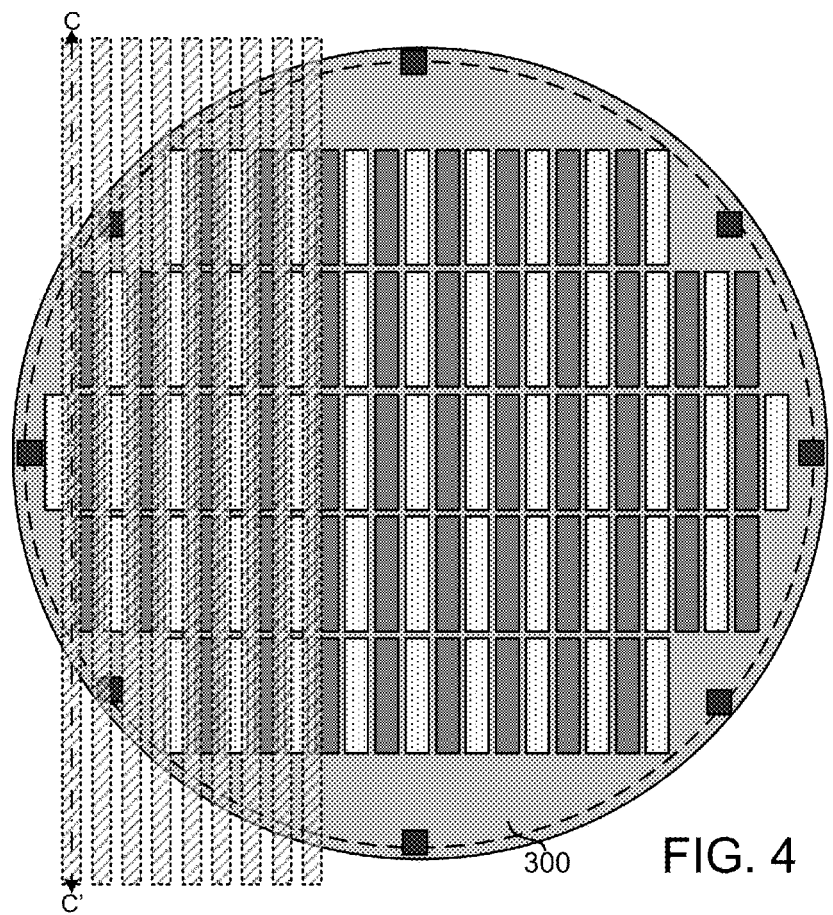

FIG. 4 is a schematic diagram showing another process of the method for assembling thermoelectric module according to an embodiment of the present invention.

Figure 4A:
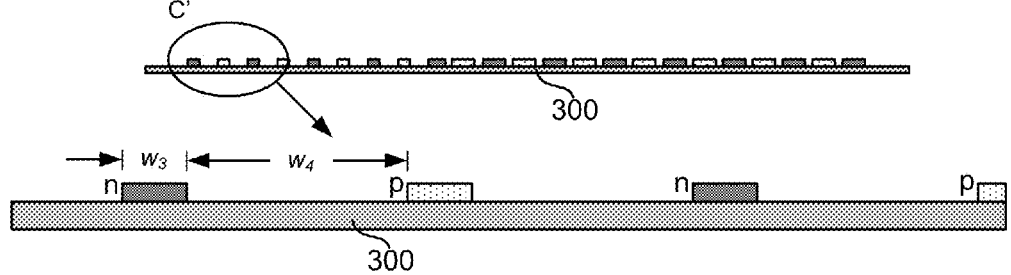

FIG. 4A is a cross-sectional view of FIG. 4 including a closer view of local structures of the thermoelectric module assembly according to an embodiment of the present invention.

Figure 5:
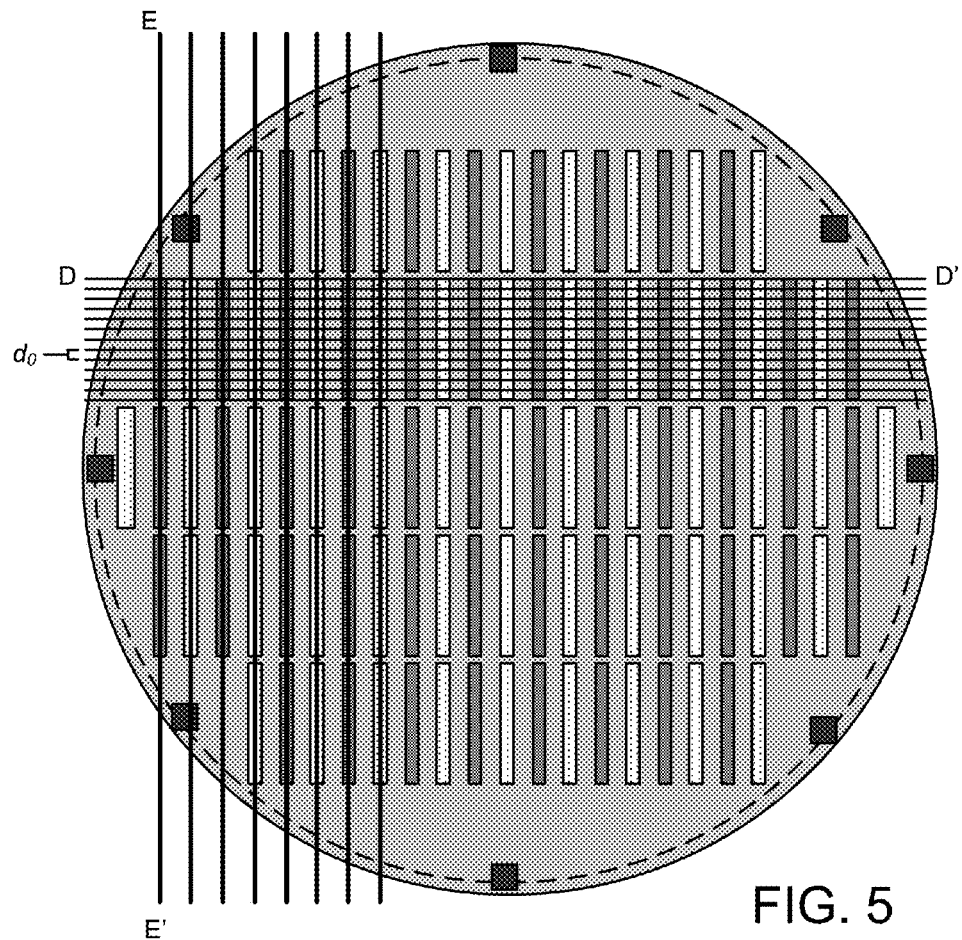

FIG. 5 is a schematic diagram showing additional processes with a series of wafer cutting operations for forming the thermoelectric unicouples according to an embodiment of the present invention.

Figure 5A:
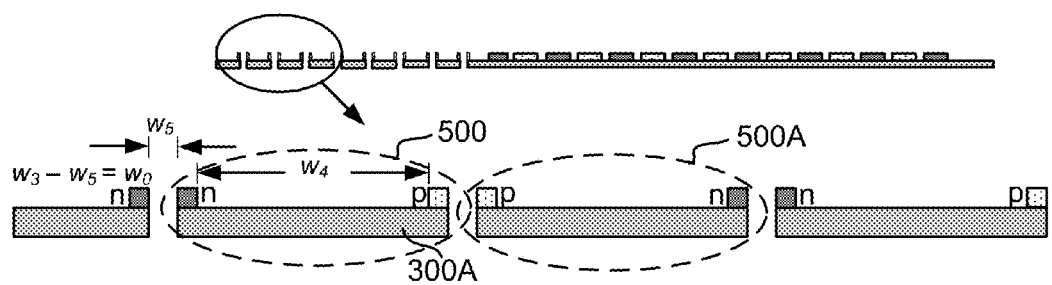

FIG. 5A is a cross-sectional view of FIG. 5 including a closer view of local structures of the thermoelectric module assembly according to an embodiment of the present invention.

Figure 6:
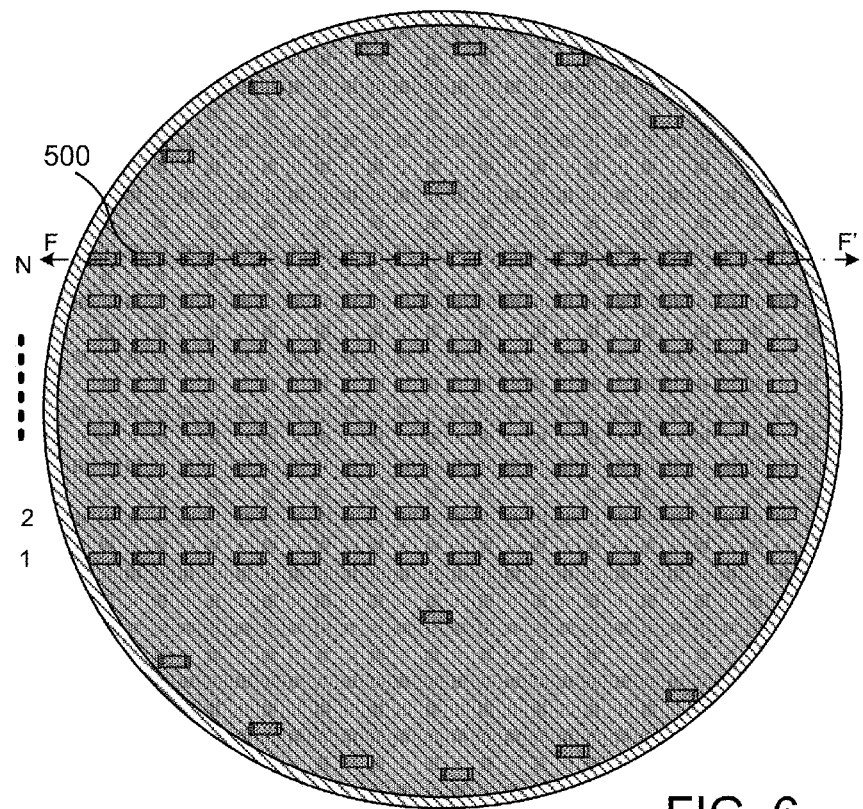

FIG. 6 is a schematic diagram showing a process of re-distributing multiple singulated unicouples according to an embodiment of the present invention.

Figure 6A:
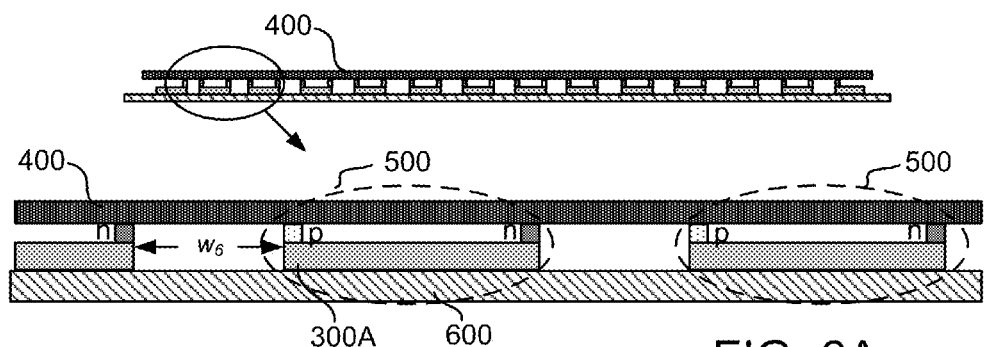

FIG. 6A is a cross-sectional view of FIG. 6 including a closer view of local structures of the thermoelectric module assembly according to an embodiment of the present invention.

Figure 7:
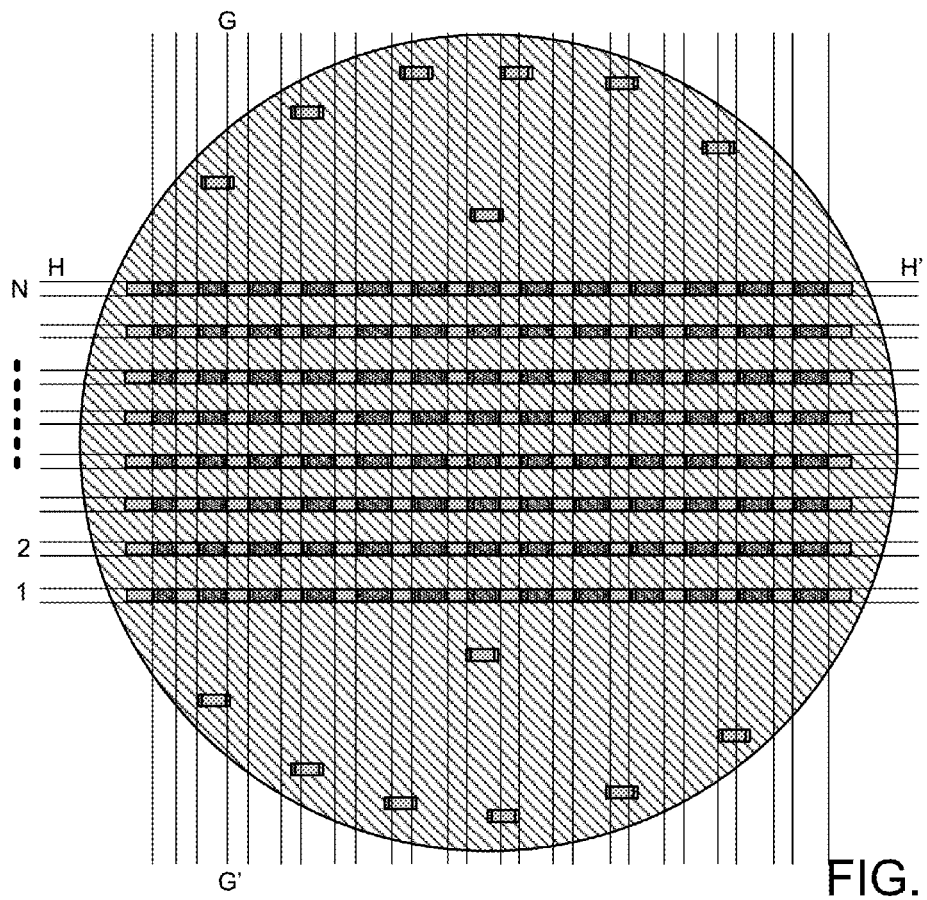

FIG. 7 is a schematic diagram showing additional processes of the method for forming the thermoelectric unicouples according to an embodiment of the present invention.

Figure 7A:
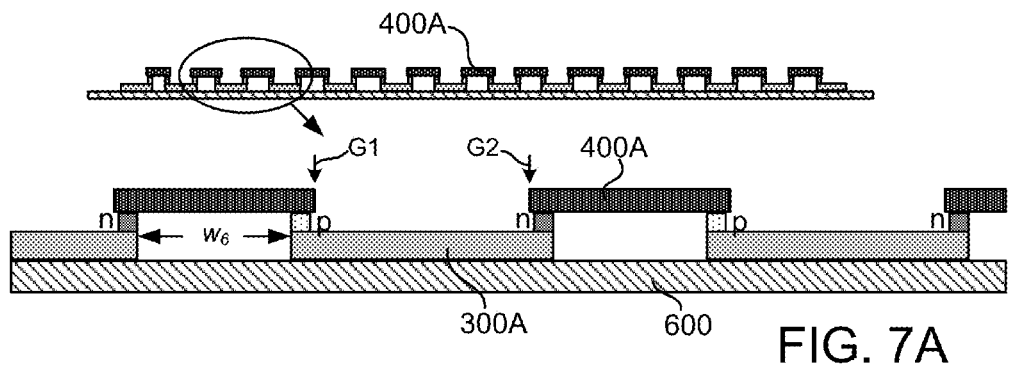

FIG. 7A is a cross-sectional view of FIG. 7 including a closer view of local structures of the thermoelectric module assembly according to an embodiment of the present invention.

Figure 8:
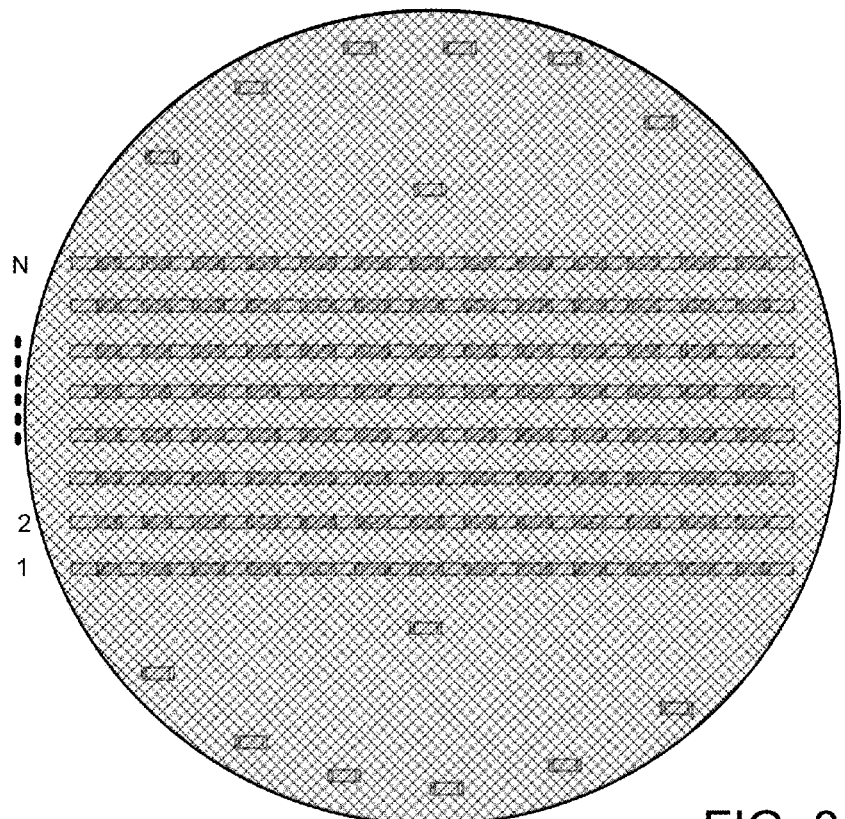

FIG. 8 is a schematic diagram showing a subsequent process of the method for assembling thermoelectric unicouples to form a thermoelectric module according to an embodiment of the present invention.

Figure 8A:
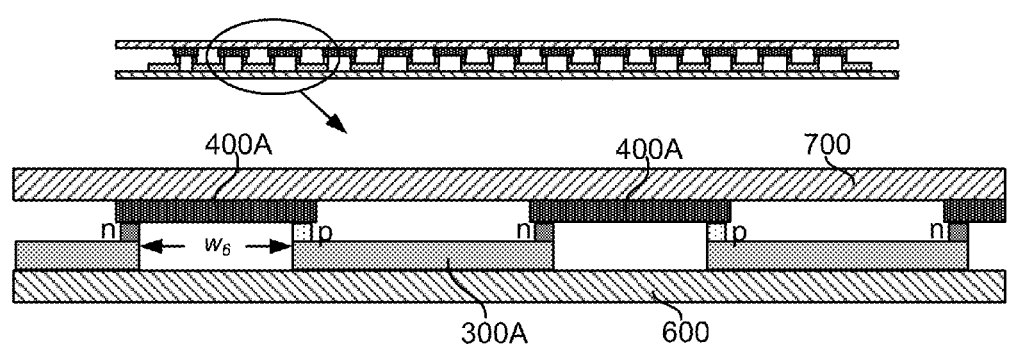

FIG. 8A is a cross-sectional view of FIG. 8 including a closer view of local structures of the thermoelectric module assembly according to an embodiment of the present invention.

Figure 9:
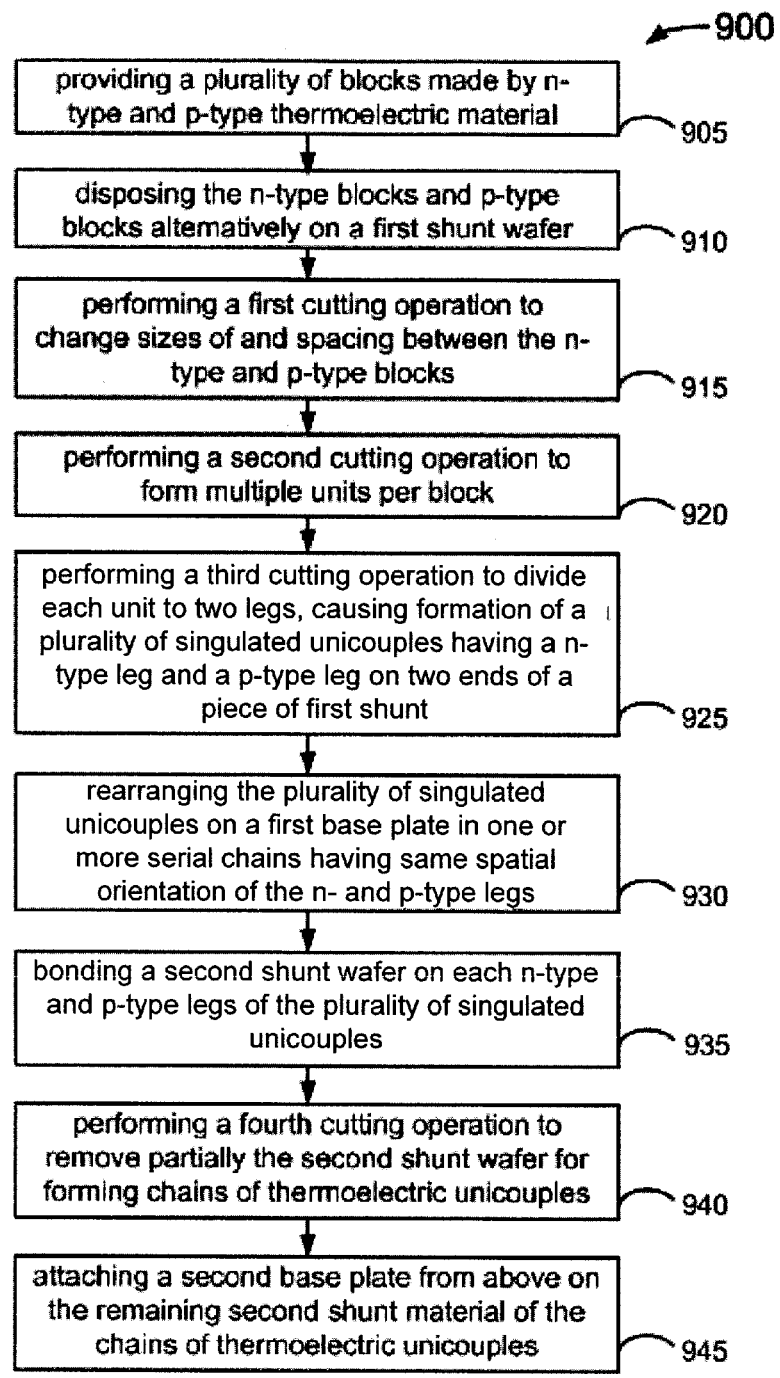

FIG. 9 is a simplified chart showing a method of forming and assembling a plurality of thermoelectric unicouples according to an embodiment of the present invention.

5. DETAILED DESCRIPTION OF THE INVENTION

The present invention is directed to thermoelectric module assembly. More particularly, the invention provides a method for forming an assembly in series of thermoelectric (TE) unicouples. Merely by way of example, the invention has been applied for sizing and assembling silicon-based thermoelectric unicouples bonded thermally in parallel and electrically in series with silicon-based contact wafers and heat sinks to form a 3D package of thermoelectric modules capable of generating electrical energy from high temperature waste heat. It would be recognized that the invention has a much broader range of applicability without limiting to specific material based TE unicouples, in various fields including but not limited to automobile combustion, industrial hot exhaust, nuclear power plants, and aircraft turbines.

Figure 1:
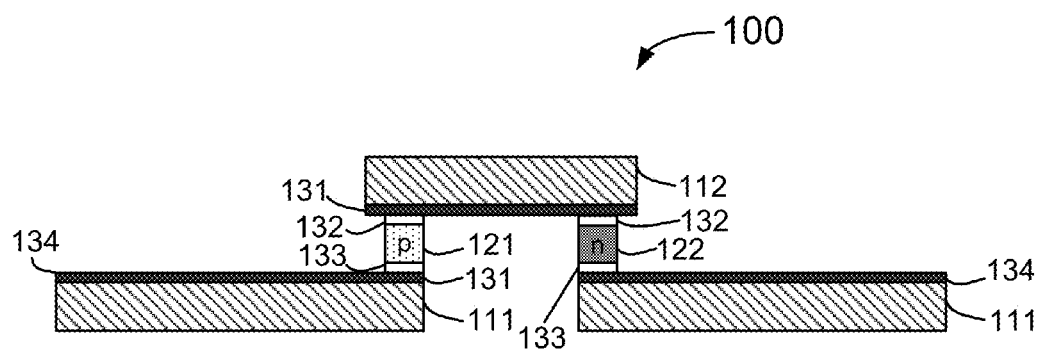
FIG. 1 shows a schematic diagram of a thermoelectric unicouple for assembling a thermoelectric module according to an embodiment of the present invention.

FIG. 1 shows a schematic diagram of a thermoelectric unicouple as a material/structure unit for assembling a thermoelectric module in a daisy chain configuration according to an embodiment of the present invention. This diagram is merely an example, which should not unduly limit the scope of the claims. One of ordinary skill in the art would recognize many variations, alternatives, and modifications. As shown, a couple of pre-fabricated thermoelectric legs are provided. One leg 121 is functionalized as a p-type semiconductor characteristic and another leg 122 is functionalized as an n-type semiconductor characteristic. In a specific embodiment, the thermoelectric legs 121 and 122, are made from silicon based nanostructures having very low thermal conductivity and high electrical conductivity. The method of fabricating the thermoelectric legs includes forming metallization layers on two contact faces of the TE legs. As shown, a first metallization layer 132 is formed on a first ending face of a TE leg 121 or 122 and a second metallization layer 133 is formed on a second ending face of the TE leg 121 or 122. The two TE legs 121 and 122 are bonded commonly with a shunt material 112. In an embodiment, the shunt material 112 is a silicon-based sheet material (flexible or rigid) processed to be a good thermal conductor and a good electrical conductor. The silicon-based shunt material 112 has its contact face coated with another metallization layer 131 that is bonded with the first metallization layer 132 of the two TE legs 121 and 122. In a specific embodiment, this shunt material 112 is configured to attach to a heat sink located at hot side (or high temperature side), namely it is called hot-side shunt. The second ending faces of the two TE legs 121 and 122 are respectively bonded to a cold-side shunt material 111. In another specific embodiment, the cold-side shunt material 111 is also a silicon-based wafer having a metallization layer 134 that is bonded with the metallization layer 133 at the second ending face of either TE leg 121 or TE leg 122. This forms a unit structure for creating a thermoelectric device and is called a thermoelectric unicouple 100.

One advantage of the present invention lies in the substantial usages of silicon as a main TE material for assembling the thermoelectric module that can be adaptable to high temperature environment with improved thermal contact and easy-to-match coefficient of thermal expansion between TE legs and shunt materials. It has also been shown (see references in US patent applications cited above) that the silicon-based thermoelectric leg, made by creating one or more novel nanostructures out of a bulk silicon material, can be very cost-effective and high in efficiency. Silicon-based material applied as a shunt material and a heat sink provides naturally excellent matching of its coefficient of thermal expansion with that of the silicon-based TE legs, minimizing associated contact stress especially in an environment with temperature greater than 600° C. Additionally, as a technologically well established electronic material, silicon can be processed easily with low cost for many aspects associated with the thermoelectric unicouple manufacture and module assembly. For example, the polished surface of silicon wafer/sheet/film provides an improved thermal contact interface. With proper doping treatment, it can be used either as a good insulator or a material that conducts electrical current. Other advantages of use of silicon for thermoelectric modules lie in the ability of silicon-based material to withstand both high and low temperature without inducing electronic property deficiency or mechanical failure of the thermoelectrics and to form improved contact conformity with the flexible silicon shunts. Many advantages can be found throughout the specification and in particularly below.

Figure 1A:
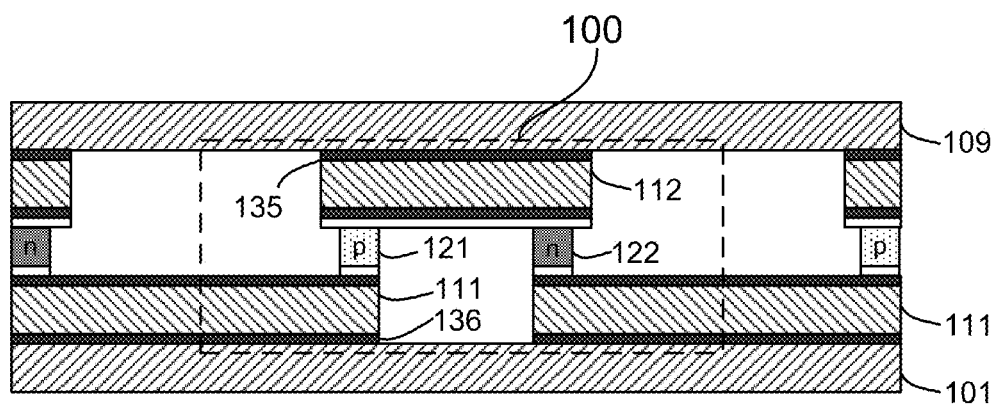
FIG. 1A shows a schematic diagram of one of a series of thermoelectric unicouples being bonded between two (a hot and a cold) heat sinks as a part of an assembled thermoelectric module according to embodiments of the present invention.

FIG. 1A shows a schematic diagram of one of a series of thermoelectric unicouples being bonded between two (a hot and a cold) heat sinks as a part of the assembled thermoelectric module according to embodiments of the present invention. This diagram is merely an example, which should not unduly limit the scope of the claims. One of ordinary skill in the art would recognize many variations, alternatives, and modifications. As shown, each thermoelectric unicouple 100 acts as a unit element of the assembled module. The top surface of the hot-side shunt 112 is bonded via a metallization layer 135 with a hot-side heat sink material 109. The hot-side heat sink 109, in fact, is an extended piece of wafer or sheet material configured to bond a series of unicouples at their hot-side shunts. Also, the bottom surface of the cold-side shunt 111 is bonded via another metallization layer 136 with a cold-side heat sink material 101. Again, the cold-side heat sink is an extended piece of wafer or sheet material configured to bond a series of unicouples at their cold-side shunts. In an example, either the hot-side or cold-side heat sink material is a silicon-based wafer or a piece of sheet material that is configured to provide substantially matching of thermal expansion coefficients of the shunt material versus sink material and enhance thermal conductance through their junctions. The heat sink material, however, is processed to maintain substantially low electrical conductivity to restrain the thermoelectric current passing along the shunt-leg-shunt pathway only through the series of TE unicouples. The structure as shown provides a single unit of an assembled thermoelectric module. The hot-side heat sink 109 and the cold-side heat sink 101 will respectively be in contact with or by itself be part of a hot-side and a cold-side heat exchanger when the assembled thermoelectric module is applied for power generation or for cooling purpose. Of course, the sink material can be changed if the shunt material changes or modified. For example, the shunt material may use good conductor like Cu or metalized ceramic and the sink material may use anodized Aluminum or stain-less steel or ceramic. Alternatively, an electrically insulated thermal interface material may be inserted between the shunt material and sink material.

In an embodiment, the metallization layers, associated with either the thermoelectric leg or the shunt material, include multilayers of metals or metal-alloy films, for example, Ti/TiN/Ni/Au/Au—Sn-alloy for the cold-side shunt, or Ti/TiN/W/W—Pt—B-alloy for the hot-side shunt. The Au—Sn alloy and the W—Pt-alloy containing 2% of B are provided as a form of nanofoil overlying the rest of the metallization layers. Nanofoil provides a unique brazing media for coupling the two metallization layers and forming excellent electrical and thermal contact at a preset stress level. Of course, there are many variations, alternatives, and modifications in layer thickness, stacking order, and specific material selection. For example, Ni layer may be replaced by a Ti layer. The metallization layers associated with the thermoelectric leg is bonded with another metallization layer of the shunt material by a bonding process. The bonding process employs localized heating of one or more layers of metal/alloy material inserted at the interface. The heating temperature locally is reached slightly above its melting point of the inserted layer to cause bonding between two metallization layers. Depending on the bonding location at the hot side or cold side of the thermoelectric leg, the inserted layer is chosen to have a melting point closely matching with the estimated working temperature correspondingly at the hot side or the cold side of the final assembled thermoelectric module. This bonding process substantially reduces the mechanical stress induced by the thermal process and enhances the application reliability of the assembled thermoelectric module.

FIGS. 2-8 schematically show a method for forming one or more thermoelectric unicouples and assembling a plurality of unicouples thermally in parallel and electrically in series for a thermoelectric module according to an embodiment of the present invention. These diagrams are merely examples, which should not limit the scope of the claims herein. One ordinary skilled in the art should recognize many alternatives, variations, and modifications. The following descriptions about each figure among the above figures are merely for schematic illustrations of one or more processes of the method using a snap shot of the physical appearance of the structures, arrangements, results of steps partially or completely executed according to the method. The claims herein should not be limited by the scope described in the figures or by any features such as dimensions, shapes, orientations, placement orders, markings for alignment or other purposes, etc. shown in the figures. They should also not be limited to terminologies used to describe the features illustrated, steps performed, tools used along with particular processes based on those exemplary figures. Each figure should not be considered as an exact matching of one step/process of the method and should not be limited in terms of the order or exclusion of additions or subtractions of one or more steps/processes.

FIG. 2 is a schematic diagram showing one or more steps for assembling a thermoelectric module according to an embodiment of the present invention. This diagram is merely an example, which should not unduly limit the scope of the claims. One of ordinary skill in the art would recognize many variations, alternatives, and modifications. In an embodiment, the method includes forming a basic thermoelectric material out of a finite semiconductor material, for example, a standard silicon wafer. The basic thermoelectric material is characterized by high figure-of-merit ZT in a form of an either n-type or p-type functionalized block having bulk-like dimension. As shown, a silicon wafer is provided for fabricating a silicon-based thermoelectric material. In an embodiment, the silicon wafer is configured to be functionalized as either n-type or p-type material. The as-formed silicon-based thermoelectric material can be in one or more forms of nanostructures created out of the whole (functionalized or standard) silicon wafer. The nanostructures may include arrays of nanowires, or arrays of nanotubes/nanoholes, or a bulk nanohole structure, or a bulk nanoporous structure, or any combination of the as-mentioned nanostructures. In another embodiment, the basic thermoelectric material is characterized as a nanocomposite material, which can be synthesized from a plurality of nano- or micro-sized particles, nanowires, nanotubes, nanoporous structured single-element or alloy materials made by various separate processes including mixing, melting, re-crystallizing, milling, doping, annealing, sintering, and more. The as-formed silicon-based thermoelectric material also bears either n-type or p-type functionalized characteristics, which is either inherited from the functionalized silicon wafer or separately treated after the formation of the one or more forms of nanostructures using doping, ion-implantation, or direct mixing of various electronic impurity elements at a desired density and polarity. Then, a filler material with low thermal/electric conductivity may be added to substantially fill the void spaces within the nanostructures, leading to the formation of the basic thermoelectric material.

FIG. 2 also shows that, after the formation of the basic thermoelectric material, the wafer can be cut into smaller sized blocks as illustrated by the rectangular shaped grid pattern. The size is predetermined in a range of a few millimeters or smaller for the purpose of assembling the thermoelectric module. FIG. 2A just shows two individual blocks after the cut. One block is indicated as n-type which is cut from an n-type functionalized wafer. Another block is p-type bearing property from a p-type functionalized wafer. Each block (either n-type or p-type) is shown in a rectangular shape w×l as a simplest choice although it is not limited to that shape. In a specific embodiment, the cutting process can be performed using known wafer-dicing or sawing technique with proper alignment. In an example, a single block has a width $w=w_1$ of about 11.5 mm and a length l ranging from 30 mm to 100 mm. The particular size here should not limit the scope of claims herein. Other dimensions of the blocks should be applicable depending on the material handled and dicing/sawing tool used. The embodiments as shown provides flexibility to determine the block width w in particular to obtain an optimum size $w_0$ of a thermoelectric leg. An optimum size is partially depended on intrinsic structure and material that forms the leg, which may be varied during development but should not be affected by applying the current method as the block disposition are very adaptive to adjust without changing the tool of the method. Although not shown in the figure, one embodiment of the present invention provides that either of these blocks contains silicon-based nanostructures and corresponding filler material to make it a unique basic thermoelectric material suitable for forming the thermoelectric unicouples and module assembly thereof. Of course, the method for assembling thermoelectric module according to the present invention should not be limited for the silicon-based thermoelectric material. Instead, the method should also be applicable to non-silicon-based basic thermoelectric material.

FIG. 3 is a schematic diagram showing a process of the method for assembling thermoelectric module according to an embodiment of the present invention. This diagram is merely an example, which should not unduly limit the scope of the claims. One of ordinary skill in the art would recognize many variations, alternatives, and modifications. The process is to pick the as-formed functionalized thermoelectric blocks and bond them on to a conductor shunt material. As shown as a top view over the shunt material 300, the n-type thermoelectric blocks are disposed one by one in a column and the p-type thermoelectric blocks are disposed one by one correspondingly in a next column. Further, more columns of alternative n-type and p-type blocks are further disposed over a major surface area of the conductor shunt material. The column to column gap is arranged with a predetermined spacing $w_2$ for properly sizing the final thermoelectric leg through a material-cutting procedure. In certain examples, final optimized size $w_0$ of a thermoelectric leg is about 0.5 mm×0.5 mm=0.25 mm² to hundreds of millimeter square. The final size $w_0$ will be much smaller than the block size $w_1$ of the as-formed thermoelectric material. But handling larger block size $w_1$ of the thermoelectric material is easier and causes much less chance to damage the nanostructures associated with the basic thermoelectric material. In another embodiment, while sizing the final thermoelectric leg around 0.25 mm² to hundreds of millimeter square is designed for making suitable dimensions of the thermoelectric unicouples used for assembling a module with nearly the highest thermoelectric efficiency for particular types of thermoelectric material used for each leg. For example, a nanostructured Si-based leg, or SiGe alloy based leg, or conventional bismuth telluride alloy based leg, can result in different optimum size in leg dimension.

In a specific embodiment, the conductor shunt material is a silicon-based thin wafer or sheet material that is chosen for matching the silicon-based thermoelectric material. The shunt material can be rigid or flexible in mechanical characteristics. Alternatively, the shunt material can be a metal and metal alloy sheet material or a conductive ceramic material. The shape of the shunt material used should not be a limiting element and it can be round shape as shown or a rectangular shape in an actual operation. In one example, the conductor shunt material may be called cold-side shunt as it is configured to be associated with a cold-side heat sink of final assembled thermoelectric module. FIG. 3A is a cross-sectional view along a BB' line of the FIG. 3 showing a plurality of thermoelectric material blocks having a first width $w_1$ disposed on a wafer of shunt material 300. A closer view of the circled portion in FIG. 3A illustrates alternative disposition of n-type block and p-type block having the first width $w_1$ and a first gap $w_2$ spacing between each other. In an example, the first width $w_1$ of each block is about 11.5 mm, and the first gap $w_2$ spacing between them is about 4.5 mm.

In another specific embodiment, bonding the thermoelectric material on the shunt material is performed using a bonding process. The silicon-based shunt wafer is processed to have its surface metalized with a bonding material. The bonding material for bonding with the metallization layer of the thermoelectric blocks is selected to have its working temperature substantially close to a cold-side working temperature of the thermoelectric module having the same shunt material in use. As the bonding material is partially melted at the working temperature by locally applied heat, the metallization layer of thermoelectric material blocks are bonded to the surface of the shunt material, reducing substantially potential thermal stress around the bonding region during the application of the thermoelectric module in the designated temperature environment.

FIG. 4 is a schematic diagram showing another process of the method for assembling thermoelectric module according to an embodiment of the present invention. It is a top view of the FIG. 3 having multiple columns of n- and p-type blocks subjected to one or more first cutting operations along a CC' direction. This diagram is merely an example, which should not unduly limit the scope of the claims. One of ordinary skill in the art would recognize many variations, alternatives, and modifications. As shown, the first cutting operation is executed with multiple cuts in a zone defined by a shaded rectangular region covering an extended range across the gap between two columns of thermoelectric material blocks. Additionally, each cut is substantially confined to a depth of the thickness of the thermoelectric material bonded on the shunt material 300. Therefore, the first cutting operation in the defined zone results in removals of part of the n-type thermoelectric block on one side of the first gap $w_2$ and part of the p-type thermoelectric block on the other side of the gap $w_2$, resulting a reduced block width (a.k.a. a second width $w_3$) and an enlarged block-to-block gap (a.k.a. a second gap $w_4$).

FIG. 4A shows a cross-sectional view and closer view of multiple columns of thermoelectric blocks having the reduced second width $w_3$ and the second gap $w_4$. The first cutting operation can be conveniently programmed to adjust the process parameters such as the second width and second gap based on one or more embodiments of the present method. In a specific example, the first cutting operation reduces 4 mm width of the n-type block and also reduces 4 mm width of the next p-type block. The block-to-block gap spacing may be enlarged from about 4.5 mm to about 12.5 mm. In an embodiment, the first cutting operation is one of a series of cutting operations for forming the thermoelectric unicouples with optimum and suitable dimensions in a 3D configuration for assembling thermoelectric modules.

FIG. 5 is a schematic diagram showing additional processes with a series of wafer cutting operations for forming the thermoelectric unicouples according to an embodiment of the present invention. This diagram is merely an example, which should not unduly limit the scope of the claims. One of ordinary skill in the art would recognize many variations, alternatives, and modifications. The top view diagram shows that a second cutting operation is performed to execute a plurality of parallel cuts along DD' direction. In an example, the DD' cut direction is perpendicular to the CC' cut direction (in FIG. 4). The cutting/sawing tool for the second cutting operations can be the same as for the first cutting operation. The second cutting operation is configured to cut to a depth at least through both the thermoelectric material block and the shunt material 300 underneath along the DD' direction, which leads to a formation of multiple parallel stripes of a serial chain of alternate n-type and p-type blocks. Each stripe has a predetermined width $d_0$ ranging from a few millimeters or greater. The width $d_0$ becomes one dimension (a.k.a. the depth) of a final thermoelectric leg. Although it should not be a limiting factor and the width $d_0$ can be adjusted with leg size optimization process. Cutting width of the second cutting operation is configured to be minimum (limited by the tool) so as to minimize material loss along the cutting line. In an embodiment, the shunt material can be pre-disposed over a tape material before the second cutting operation. The tape material still holds the cut stripes after the second cutting operation.

FIG. 5 also shows that at least a third cutting operation is performed along EE' direction with a cutting line set to a central line through each n-type and p-type block with the second width $w_3$. The EE' cut direction is substantially parallel to the CC' cut direction. In an embodiment, the third cutting operation is configured to cut through the thermoelectric material as well as the shunt material 300 underneath with a finite cutting width $w_5$. Therefore, the third cutting operation further reduces the second width of each n-type or p-type block to a third width and separates stripe of shunt material 300 into multiple sections 300A. It is intended to obtain a final width $w_0$ of a pair of thermoelectric legs defined by $w_0 = w_3 - w_5$. In a specific example, the cutting width $w_5$ of the third cutting operation is set to be about 2.5 mm. As the result on this cutting width $w_5$, each n-type block or p-type block is reduced from a single block of 3.5 mm or greater to two n-type legs or two p-type legs of about $w_0 = 0.5$ mm or greater, as seen in a detailed view in FIG. 5A. One n-type leg and one p-type leg are respectively attached to two ends of each section of shunt material 300a, forming a singulated unicouple 500.

FIG. 5A shows a cross-sectional view along the second cutting line and a detailed view of the circled region with several n-type legs and p-type legs on isolated sections of shunt material in a serial chain configuration. After the third cutting operation, each of a plurality of parallel serial chains of alternate n-type and p-type legs along the DD' direction is separated into multiple individual singulated unicouples 500 and 500A with an alternate n-p and p-n sequential order of the leg spatial orientation. The singulated unicouple 500A is substantially the same as singulated unicouple 500 except that the former one is oppositely oriented. Because the shunt material 300 has been pre-attached on a tape material (from bottom, not shown), each singulated unicouple 500 remains being attached with the tape material in its position.

FIG. 6 is a schematic diagram showing a process of re-distributing the singulated unicouples according to an embodiment of the present invention. This diagram is merely an example, which should not unduly limit the scope of the claims. One of ordinary skill in the art would recognize many variations, alternatives, and modifications. As shown, the individual singulated unicouples 500 resulted from the third cutting operation are respectively picked up from the tape material and re-disposed on a heat sink material 600 one after another in multiple thermally in parallel electrically in series chain configurations along FF' direction. Process equipment used for this operation is a die bonder consisting of a dispenser which provides uniform epoxy or silver glass dispensing with consistent material thickness and precise die placement in a given location. Then it is used to pick, align and dispose a singulated unicouple 500 in the same location where a preformed epoxy or dispensed material has been placed along FF' lines. The process for redistributing the singulated unicouples includes aligning multiple singulated unicouples 500 to form a serial chain in an n-p n-p sequential order along the FF' lines (switching orientation of singulated unicouple 500A, see FIG. 5A). The process further bonds each singulated unicouple 500, including an n-type leg and a p-type leg respectively on two ends of each section of shunt material 300A, to a metallization layer overlying the heat sink material 600 to complete the chain configuration. The heat sink material can also be selected from a silicon-based wafer or sheet material for matching coefficient of thermal expansion of the silicon-based shunt material and silicon nanostructured thermoelectric legs. The heat sink material, in an example, is a cold-side heat sink configured to be in contact with a cold-side heat exchanger as the to-be-formed thermoelectric module is disposed. In the above serial chain configuration, each singulated unicouple 500 is separated from its nearest neighbor by a pitch distance $w_6$ (see FIG. 6A). In a specific example, each singulated unicouple 500 has two legs located on two ends of a section of shunt material 300A with a gap spacing of about 12.5 mm. Each leg has a width $w_0 = 0.5$ mm and a depth $d_0$ ranging from 0.5 mm to a few millimeters depending on settings in the second cutting operation. The serial chain configuration of these singulated unicouples has a pitch distance of $w_6 = 10$ mm. Of course, these parameters associated with the chain configuration and leg dimensions can be varied and easily adjusted under the same tooling for the current method depending on thermoelectric leg material and structural optimization as well as the thermal environment for specific applications. Additionally, as shown in FIG. 6, the spacing between each parallel serial chains of singulated unicouples is operably set to constant value of about 20 mm, increased from row 1 to row N (N>1), decreased from row 1 to row N, or in other orders depending on embodiments.

FIG. 6 also shows a subsequent process of bonding a second shunt material 400 on top ending faces of the n-type or p-type legs among all the individual singulated unicouples 500 already disposed on the heat sink material 600 in the redistribution process mentioned above. In an embodiment, this second shunt material 400 can be selected from a silicon based wafer or sheet material, which is configured for further forming thermal contact with a hot-side heat sink (to be seen in FIG. 8 below) associated the physical configuration of the to-be-formed thermoelectric module. In an embodiment, the hot-side shunt material 400 includes Silicon (shown as darker colored wafer) with a proper metallization layer on its surface that is bonded with the pre-coated metallization layers on the top ending faces of the n-type legs and p-type legs of all singulated unicouples 500 mentioned above (also see FIG. 1 for metallization layer for bonding the thermoelectric legs). FIG. 6A shows a cross-sectional view along a chain of singulated unicouples 500 in FF' direction of FIG. 6 after the hot-side shunt material 400 is disposed thereon. As shown, a three-dimensional configuration of the thermoelectric module comprising multiple unicouples has been primarily formed.

FIG. 7 is a schematic diagram showing additional processes of the method for forming the thermoelectric unicouples according to an embodiment of the present invention. This diagram is merely an example, which should not unduly limit the scope of the claims. One of ordinary skill in the art would recognize many variations, alternatives, and modifications. As shown, more cutting operations are performed for assembling the chains of thermoelectric unicouples. In particular, a fourth cutting operation is performed to cut through the hot-side shunt material 400 along a GG' line direction in designated positions associated with the singulated unicouples 500. For each singulated unicouple 500, two GG' line cuttings are performed. One cutting line G1 is aligned to near an inner side edge of an n-type leg of a singulated unicouple 500 and another cutting line G2 is aligned to near an inner side edge of p-type leg of the same singulated unicouple 500. The two cuttings are both stopped as their depths just surpass the thickness of the hot-side shunt material so that a section of the hot-side shunt material 400 is removed while leaving the two legs and the section of cold-side shunt material 300A below in tack. All GG' cutting operations are applied to other similar regions to leave one or more bridge section of hot-side shunt material 400A bonded over two legs, one p-type leg of one singulated unicouple and one n-type leg of a next singulated unicouple, as shown as seen in a cross-sectional view in FIG. 7A. As the result, a thermoelectric unicouple structure (e.g., 100 shown in FIG. 1A) is formed around the bridge section of the hot-side shunt material bonded commonly with a p-type leg and an n-type leg which are respectively bonded to two sections of the cold-side shunt material, each of them being configured to couple a next unicouple with the same structure.

FIG. 7 also shows a sequential process of the method, wherein the fourth cutting operation is further performed along HH' direction according to an embodiment of the present invention. Multiple cuts are performed in this cutting operation along the HH' direction. For each serial chain numbered from 1 through N, two cuts are executed along HH' lines near the two longitudinal edges of the unicouples. In an embodiment, each of these two cuts is stopped as its depth just surpasses the thickness of the hot-side shunt material 400 to make sure its removal from two sides of each serial chain. As the results of this HH' cutting operation across the whole hot-side shunt material, several parallel serial chains of thermoelectric unicouples numbered from 1 through N are formed. Each serial chain of thermoelectric unicouples is also known as a daisy chain structure. In a specific example, FIG. 7A is a cross-sectional view along FF' line in FIG. 7 showing a plurality of thermoelectric unicouples formed in a serial chain configuration according to an embodiment of the present invention. Multiple serial chains of thermoelectric unicouples can be laid out in a 2D arrangement (as seen in FIG. 7) for assembling a macroscopic-scaled thermoelectric module. Total number of unicouples in each serial chain can be varied depending on embodiments.

FIG. 8 is a schematic diagram showing a subsequent process of the method for assembling thermoelectric unicouples to form a thermoelectric module according to an embodiment of the present invention. This diagram is merely an example, which should not unduly limit the scope of the claims. One of ordinary skill in the art would recognize many variations, alternatives, and modifications. The formation of one or more daisy chain structures of thermoelectric unicouples leaves multiple sections of hot-side shunt material 400A on top of each unicouple along the chain. A hot-side heat sink (wafer or sheet) material 700 is applied to bond with the top-most sections of the hot-side shunt material 400A of all the daisy chain structures to form the assembly of all the thermoelectric unicouples according the embodiment of the invention.

FIG. 8A is a cross-sectional view of the assembly of the thermoelectric unicouples of FIG. 8 along one daisy chain structured unicouples. As shown, a three-dimensional arrangement of each unicouple includes an n-type thermoelectric leg and a p-type thermoelectric leg having their one ending faces respectively bonded to two sections of a first shunt and their another ending faces separately bonded to two end regions of a same section of a second shunt (See FIG. 1). In an embodiment, the first shunt is configured to couple with a cold-side heat sink which is designed for attaching to a low-temperature heat exchanger and the second shunt is configured to couple with a hot-side heat sink which is designed for attaching to a high-temperature heat exchanger (see FIG. 1A). In a specific embodiment, a daisy chain configuration is formed with a series of such thermoelectric unicouples being connected linearly such that all the thermoelectric unicouples are coupled electrically in series and thermally in parallel (see FIG. 7A). Multiple such daisy chain structures can be laid out thermally in parallel and electrically in series and coupled one by one electrically, leading to a formation a thermoelectric module having their cold-side shunt materials commonly coupled to a cold-side heat sink material and their hot-side shunt materials commonly coupled to a hot-side heat sink material (see FIG. 8).

In a specific embodiment, a method for assembling a plurality of thermoelectric unicouples is provided. FIG. 9 is a simplified chart showing a method of forming and assembling a plurality of thermoelectric unicouples according to an embodiment of the present invention. This diagram is merely an example, which should not unduly limit the scope of the claims. One of ordinary skill in the art would recognize many variations, alternatives, and modifications. As shown, the method 900 includes a step 905 of providing a plurality of blocks made by n-type and p-type thermoelectric material. In an implementation of this step, a plurality of material blocks is provided with a rectangular shape having a width and a length cut from a wafer (see FIG. 2 and FIG. 2A) made by either n-type or p-type thermoelectric functional semiconductor material. For example, the wafer can be a silicon-based wafer having a plurality of nanowires or nanotubes being etched directly from a crystalline silicon wafer and further doped with proper electronic impurities to give desired n-type and p-type semiconductor characteristics. Each material block is cut from the wafer. In another example, each material block can be a sintered nano-composite material independently fabricated from a plurality of nano-particles pre-manufactured based various processes including melting, mixing, solidification, milling, and doping, etc.

The method 900 further includes a step 910 of disposing the n-type blocks and p-type blocks alternatively on a first shunt wafer. As shown in FIG. 3, the plurality of material blocks is disposed on a first shunt wafer in a 2D array wherein each n-type block is alternately disposed next to a p-type block. The first shunt wafer is an electrically conductive sheet material. For example, it can be a Cu lead frame coated with Ni material. The disposing the plurality of material blocks may include process of bonding each material block onto the first shunt wafer via a metalized material made by a multilayered film of Ti/TiN/Ni/Au/Au—Sn alloy or Ni/TiN/Ni/Au/Au—Sn Alloy using a brazing process. In specific embodiment, the first shunt wafer is designated for being used for attaching with a cold side heat sink, thereby the material selection and process treatment all are designed to make the internal stress across the thermoelectric material block and the shunt to be adaptive to relative low temperature environment for the thermoelectric application.

Additionally, the method 900 includes a step 915 of performing a first cutting operation to change sizes of and spacing between the n-type and p-type blocks. As shown in FIG. 4, in a specific implementation of the step 915, the first cutting operation is performed along the length of the blocks (e.g., along CC' direction) to reduce the width of each block and increase a gap spacing between two neighboring blocks while substantially free from removing any material of the first shunt wafer (see FIG. 4A also). A process of taping the first shunt material including the plurality of blocks thereon onto a removable tape is introduced after the first cutting operation.

The method 900 further includes a step 920 of performing a second cutting operation to form multiple units per block. As shown in FIG. 5, in a specific implementation of the step 920, the second cutting operation is performed along the width of each block (e.g., along DD' direction) to cut the thermoelectric material and through the first shunt wafer material below to divide each block along the length into a column of multiple units. This is to redefine the thermoelectric blocks in sizes and gap spacing for facilitating volume production utilizing common semiconductor wafer processing technology.

Furthermore, the method 900 includes a step 925 of performing a third cutting operation to divide each unit to two legs, causing a formation of a plurality of singulated unicouples having a n-type leg and a p-type leg on two ends of a piece of first shunt. As shown in FIG. 5, in a specific implementation of the step 925, the third cutting operation is performed along middle line of each column of multiple units through the first shunt wafer below (e.g., along EE' direction) to further cut each unit into two thermoelectric functional legs respectively attached on two separate remaining pieces of the first shunt wafer (see also FIG. 5A). Accordingly a plurality of singulated unicouples is formed and each singulated unicouple is made of a n-type thermoelectric functional leg attached at one end and a p-type thermoelectric functional leg attached at another end of a same remaining piece of the first shunt wafer.

The method 900 also includes a step 930 of rearranging the plurality of singulated unicouples on a first base plate in one or more serial chains having same spatial orientation of the n- and p-type legs. As shown in FIG. 6, the plurality of singulated unicouples 500 is rearranged in one or more serial chains numbered from 1 through N by bonding the remaining piece of the first shunt wafer 300 of each singulated unicouple 500 onto a first base plate 600 such that every singulated unicouple 500 in the serial chain (e.g., chain #1) comprises a same spatial orientation of a n-type thermoelectric functional leg on one end and a p-type thermoelectric functional leg on other end of a same piece of the first shunt wafer (see FIG. 6A). The first base plate 600 is an electrical insulating material used as a heat sink for the thermoelectric legs. For example, a hard anodized aluminum is used for making the first base plate.

The method 900 continues to include a step 935 of bonding a second shunt wafer on each n-type and p-type legs of the plurality of singulated unicouples. As shown in FIG. 6 and FIG. 6A, the second shunt wafer 400 is attached onto the n-type thermoelectric functional leg and the p-type thermoelectric functional leg of each singulated unicouple in the one or more serial chains numbered from 1 through N. The process of bonding the second shunt wafer on the thermoelectric leg includes brazing a multilayer of metalized film made by Ni/TiN/W/W—Pt Alloy with 2% of B, or Ti/TiN/W/W—Pt Alloy including a Pd—Al nanofoil for facilitating the brazing process.

Moreover, the method 900 includes another step 940 of performing a fourth cutting operation to remove partially the second shunt wafer for forming chains of thermoelectric unicouples. As shown in FIG. 7, in a specific implementation of the step 940, the fourth cutting operation is performed to remove material of the second shunt wafer partially from regions beyond two longitudinal edges (along HH' direction) of each serial chain and regions between the n-type thermoelectric functional leg and the p-type thermoelectric functional leg (along GG' direction) of each singulated unicouple while substantially free from removing any material of the first shunt wafer and the first base plate (also see FIG. 7A). Thus, a plurality of thermoelectric unicouples (e.g., 100 shown in FIG. 1A) is formed along each of the one or more serial chains numbered from 1 through N. The method 900 further includes a step 945 of attaching a second base plate from above to bond each and every remaining piece of the second shunt wafer. As shown in FIG. 8 and FIG. 8A, the second base plate 700 is attached onto each remaining piece of the second shunt wafer (400A) of the plurality of thermoelectric unicouples.

The method further may include a fifth cutting operation for forming one or more daisy chains of thermoelectric unicouples assembled between the first base plate and the second base plate. Each daisy chain of thermoelectric unicouples is characterized at least by a serial electrical conduction path from at least one piece of the first shunt wafer, through one or more n-type thermoelectric functional legs, through at least one piece of the second shunt wafer, to one or more p-type thermoelectric functional legs, and a parallel thermal conduction path from the first base plate through all pieces of the first shunt wafer, through all the n-type thermoelectric functional legs and all the p-type thermoelectric functional legs, through all pieces of the second shunt wafer, to the second base plate.

It is also understood that the examples and embodiments described herein are for illustrative purposes only and that various modifications or changes in light thereof will be suggested to persons skilled in the art and are to be included within the spirit and purview of this application and scope of the claims.

What is claimed is:

1. A method for assembling a plurality of thermoelectric unicouples, the method comprising:
providing a plurality of blocks, each block having a generally rectangular shape having a width and a length, each block of the plurality including either an n-type thermoelectric functional semiconductor material or a p-type thermoelectric functional semiconductor material;

disposing the plurality of blocks on a first shunt wafer in a 2D array wherein each of the blocks including the n-type thermoelectric functional material is alternately disposed next to one of the blocks including the p-type thermoelectric functional material;

performing a first cutting operation along the length of each block to reduce the width of each block and increase a gap spacing between two neighboring blocks substantially without removing any material of the first shunt wafer;

performing a second cutting operation along the width of each block through the first shunt wafer below to divide each block along the length into a column of multiple units;

performing a third cutting operation along a middle line of each column of multiple units through the first shunt wafer below to further cut each unit of each of the columns of multiple units into two thermoelectric functional legs respectively attached on two separate remaining pieces of the first shunt wafer, the combination of the first cutting operation, the second cutting operation, and the third cutting operation causing a formation of a plurality of unicouples each comprising the two thermoelectric functional legs, the two thermoelectric functional legs comprising an n-type thermoelectric functional leg attached at one end of a same remaining piece of the first shunt wafer and a p-type thermoelectric functional leg attached at another end of the same remaining piece of the first shunt wafer;

re-arranging the plurality of unicouples in one or more serial chains by bonding the same remaining piece of the first shunt wafer of each unicouple onto a first base plate such that every unicouple in the serial chain comprises a same spatial orientation of the n-type thermoelectric functional leg on one end and the p-type thermoelectric functional leg of that unicouple on another end of the same remaining piece of the first shunt wafer;

bonding a second shunt wafer to the n-type thermoelectric functional leg and the p-type thermoelectric functional leg of each unicouple in the one or more serialchains;

performing a fourth cutting operation to remove material of the second shunt wafer partially from regions beyond two longitudinal edges of each serial chain and regions between the n-type thermoelectric functional leg and the p-type thermoelectric functional leg of each unicouple substantially without removing any material of the first shunt wafer and the first base plate; and attaching a second base plate from above to bond with each and every remaining piece of the second shunt wafer.

2. The method of claim 1 further comprising a fifth cutting operation for forming one or more daisy chains of thermoelectric unicouples assembled between the first base plate and the second base plate, the daisy chain of thermoelectric unicouples being characterized at least by a serial electrical conduction path from at least one piece of the first shunt wafer, through one or more of the n-type thermoelectric functional legs, through at least one piece of the second shunt wafer, to one or more of the p-type thermoelectric functional legs, and a parallel thermal conduction path from the first base plate through all pieces of the first shunt wafer, through all the n-type thermoelectric functional legs and all the p-type thermoelectric functional legs, through all pieces of the second shunt wafer, to the second base plate.

3. The method of claim 1 wherein the n-type thermoelectric functional semiconductor material or the p-type thermoelectric functional semiconductor material comprises silicon-based thermoelectric material bearing one or more forms of nanostructures selected from the group consisting of: an array of nanowires, nanotubes, or nanoholes, a bulk nanohole structure, and a bulk nanoporous structure.

4. The method of claim 1 wherein the n-type functional semiconductor material or the p-type thermoelectric functional semiconductor material comprises a nanocomposite material synthesized from a plurality of nano- or micro-sized particles, nanowires, or nanotubes, or from a nanoporous bulk including a single element or an alloy including at least two materials.

5. The method of claim 1 wherein disposing the plurality of blocks comprises bonding each block onto the first shunt wafer via a metalized material using a brazing process, the metalizing material including a multilayered film including Ti/TiN/Ni/Au/Au—Sn alloy or Ni/TiN/Ni/Au/Au—Sn alloy.

6. The method of claim 1 wherein the first shunt wafer comprises a conductive material selected from the group consisting of: a silicon-based composite material having a metalized surface, a Cu lead frame plated with Ni material, a W lead frame plated with Ni material, and a conductive ceramic material.

7. The method of claim 1 wherein the first cutting operation is configured to reduce the width of each block to about 3.5 mm while increasing the gap spacing to about 12.5 mm between the two neighboring blocks, wherein the two neighboring blocks include one of the blocks including the n-type thermoelectric functional material and a neighboring one of the blocks including the p-type thermoelectric functional material along the width direction.

8. The method of claim 1 further comprising taping the first shunt material including the plurality of blocks thereon onto a removable tape after the first cutting operation.

9. The method of claim 1 wherein the second cutting operation is configured to form the column of multiple units bearing the same n-type thermoelectric functional semiconductor material or the same p-type thermoelectric functional material of the block respectively bonded on remaining pieces of the first shunt wafer, each unit bearing a width of about 0.5 mm and a length of about 3.5 mm.

10. The method of claim 1 wherein the third cutting operation is configured to form the two thermoelectric functional legs with substantially a same dimension ranging from 0.5 mm to 1.5 mm by removing the semiconductor material from a middle region of each of the column of multiple units.

11. The method of claim 1 wherein the first base plate includes an electrically insulating heat sink material comprising hard anodized aluminum.

12. The method of claim 1 wherein re-arranging the plurality of unicouples comprises disposing each of the unicouples with a gap spacing of about 10 mm from another of the unicouples that has the same spatial orientation of the n-type thermoelectric functional leg on one end and the p-type thermoelectric functional leg on another end of a same piece of the first shunt wafer.

13. The method of claim 1 wherein the second shunt wafer includes a W lead frame.

14. The method of claim 1 wherein bonding the second shunt wafer the n-type thermoelectric leg and the p-type thermoelectric functional leg comprises brazing a multilayer of metalized film, the multilayer of metalized film including Ni/TiN/W/W—Pt alloy with 2% of B or Ti/TiN/W/W—Pt alloy Alley including a Pd—Al nanofoil for facilitating the brazing process.

15. The method of claim 1 wherein the second base plate includes a low electrical conductivity heat sink material including alumina.

16. The method of claim 1 wherein the first base plate defines a cold side heat sink and the second base plate defines a hot side heat sink.

17. A method for assembling thermoelectric unicouples to form a thermoelectric module, the method comprising:
disposing a plurality of thermoelectric blocks, each block including either an n-type semiconductor characteristic or a p-type semiconductor characteristic, onto a first shunt wafer;
resizing the thermoelectric blocks of the plurality of thermoelectric blocks and resizing a gap spacing between at least one of the blocks including the n-type semiconductor characteristic and at least one of the blocks including the p-type semiconductor characteristic without removing any material from the first shunt wafer;
partially removing one or more materials of each of the thermoelectric blocks of the plurality and the first shunt wafer along a middle region of that thermoelectric block to form a plurality of unicouples comprising a separate partial piece of the first shunt wafer with an n-type thermoelectric leg attached on one end and a p-type thermoelectric leg attached on another end;
rearranging the plurality of unicouples to form one or more daisy chains on a first heat sink plate, wherein each unicouple has a same spatial orientation of the n-type thermoelectric leg and the p-type thermoelectric leg and is disposed at a predetermined space from a neighboring unicouple within each of the one or more daisy chains;
bonding a second shunt wafer onto the plurality of unicouples;
resizing the second shunt wafer to retain a partial piece of the second shunt wafer connecting the n-type thermoelectric leg of one unicouple with the p-type thermoelectric leg of the neighboring unicouple; and
attaching a second heat sink plate onto each retained partial piece of the second shunt wafer.

18. The method of claim 17 wherein the first shunt wafer and the second shunt wafer each include a metal-based lead frame respectively bonded via a multilayer-metallization film with a cold end and a hot end of each n-type thermoelectric leg or each p-type thermoelectric leg.

19. The method of claim 17 wherein the plurality of thermoelectric blocks is provided from a nanocomposite material bearing silicon-based nano-structures or sintered nano-particles doped with either n-type or p-type electronic impurities.

20. The method of claim 17 wherein the first heat sink plate and the second heat sink plate each include an electrically insulating material respectively configured to couple the first shunt wafer to a cold side surface near a room temperature and couple the second shunt wafer to a hot side surface above 600° C.

21. A method for forming a plurality of unicouples for assembling a thermoelectric module, the method comprising:
providing a plurality of blocks, each block having a generally rectangular shape having a width and a length, each block of the plurality including either an n-type thermoelectric functional material or a p-type thermoelectric functional semiconductor material;
disposing the plurality of blocks on a conductive shunt wafer in a 2D array wherein each of the blocks including the n-type thermoelectric functional material is alternately disposed next to one of the blocks including the p-type thermoelectric functional material;
performing a first cutting operation along the length of each block to reduce the width of each block and increase a gap spacing between two neighboring blocks substantially without removing any material of the conductive shunt wafer;
performing a second cutting operation along the width of each block through the conductive shunt wafer below to divide each block along the length into a column of multiple units; and
performing a third cutting operation along a middle line of each column of multiple units through the conductive shunt wafer below to further cut each unit of each of the columns of multiple units into two thermoelectric functional legs respectively attached on two separate remaining pieces of the conductive shunt wafer, thereby forming a plurality of unicouples each comprising an n-type thermoelectric functional leg attached at one end of a same remaining piece of the conductive shunt wafer and a p-type thermoelectric functional leg attached at another end of the same remaining piece of the conductive shunt wafer.

22. A method for assembling a plurality of unicouples to form a thermoelectric module, the method comprising:
providing a plurality of unicouples, each unicouple including an n-type thermoelectric functional leg and a p-type thermoelectric functional leg respectively attached to two ends of a stripe-shaped piece of a first shunt material;
arranging the plurality of unicouples in one or more serial chains by bonding each piece of the first shunt material onto a first base plate, each serial chain comprising a same spatial orientation such that the n-type thermoelectric functional leg of a unicouple is spatially opposed to a p-type thermoelectric functional leg of a next unicouple with a predetermined spacing;
bonding a wafer piece of a second shunt material from above to each of the plurality of unicouples in the one or more serial chains;
performing a cutting operation to partially remove the second shunt material from regions beyond two longitudinal edges of each serial chain and regions between the n-type thermoelectric functional leg and the p-type thermoelectric functional leg of each unicouple substantially without removing any first shunt material and the first base plate; and
attaching a second base plate from above to bond with each and every remaining piece of the second shunt material.

* * * * *